(12) United States Patent
Glemet et al.

(10) Patent No.: US 11,869,919 B2
(45) Date of Patent: Jan. 9, 2024

(54) METHOD FOR MANUFACTURING A SENSOR DEVICE WITH A BURIED DEEP TRENCH STRUCTURE AND SENSOR DEVICE

(71) Applicant: Infineon Technologies Dresden GmbH & Co. KG, Dresden (DE)

(72) Inventors: Magali Glemet, Dresden (DE); Boris Binder, Dresden (DE); Henning Feick, Dresden (DE); Dirk Offenberg, Dresden (DE)

(73) Assignee: Infineon Technologies Dresden GmbH & Co. KG, Dresden (DE)

( * ) Notice: Subject to any disclaimer, the term of this patent is extended or adjusted under 35 U.S.C. 154(b) by 235 days.

(21) Appl. No.: 17/104,568

(22) Filed: Nov. 25, 2020

(65) Prior Publication Data
US 2021/0167117 A1 Jun. 3, 2021

(30) Foreign Application Priority Data
Nov. 29, 2019 (EP) ..................................... 19212580

(51) Int. Cl.
*H01L 27/14* (2006.01)
*H01L 27/146* (2006.01)

(52) U.S. Cl.
CPC .. *H01L 27/14687* (2013.01); *H01L 27/14632* (2013.01)

(58) Field of Classification Search
CPC ..................... H01L 27/14687; H01L 27/14632
See application file for complete search history.

(56) References Cited

U.S. PATENT DOCUMENTS

| | | | |
|---|---|---|---|
| 7,659,564 B2* | 2/2010 | Adkisson | H01L 27/1463 257/E31.038 |
| 8,106,432 B2* | 1/2012 | Adkisson | H01L 27/14643 257/E31.038 |
| 8,440,490 B2* | 5/2013 | Adkisson | H01L 27/14643 438/57 |
| 10,541,261 B2* | 1/2020 | Roessler | H01L 31/101 |
| 2007/0187734 A1* | 8/2007 | Adkisson | H01L 27/14689 257/E31.038 |

(Continued)

*Primary Examiner* — Mounir S Amer
*Assistant Examiner* — Alexander Belousov
(74) *Attorney, Agent, or Firm* — Murphy, Bilak & Homiller, PLLC

(57) ABSTRACT

A sensor device includes: a semiconductor substrate having a sensing region which extends vertically below a main surface region of the semiconductor substrate into the substrate; a semiconductor capping layer that extends vertically below the main surface region into the substrate; a buried deep trench structure that extends vertically below the capping layer into the substrate and laterally relative to the sensing region, the buried deep trench structure including a doped semiconductor layer that extends from a surface region of the buried deep trench structure into the substrate; a trench doping region that extends from the doped semiconductor layer of the buried deep trench structure into the substrate; and electronic circuitry for the sensing region in a capping region of the substrate vertically above the buried deep trench structure. Methods of manufacturing the sensor device are also provided.

16 Claims, 24 Drawing Sheets

(56) References Cited

U.S. PATENT DOCUMENTS

| | | | |
|---|---|---|---|
| 2010/0084690 A1* | 4/2010 | Adkisson | H01L 27/14643 257/E27.15 |
| 2012/0122261 A1* | 5/2012 | Adkisson | H01L 27/1463 438/57 |
| 2015/0380447 A1* | 12/2015 | Chou | H01L 27/1463 438/72 |
| 2018/0108692 A1* | 4/2018 | Roessler | H01L 27/14609 |
| 2018/0145164 A1* | 5/2018 | Dasgupta | H01L 29/0657 |
| 2019/0096929 A1* | 3/2019 | Chiang | H01L 27/14612 |

* cited by examiner

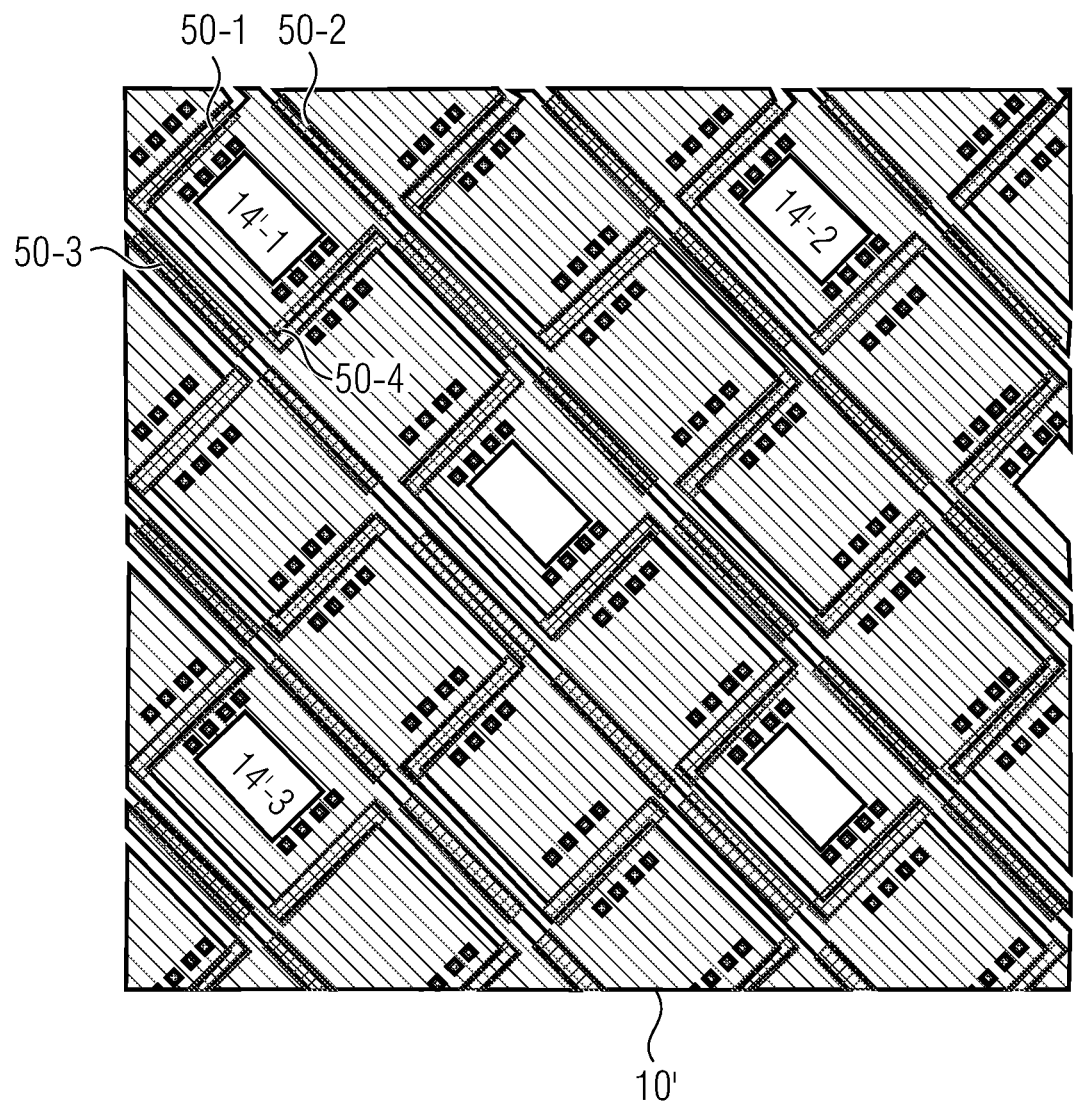
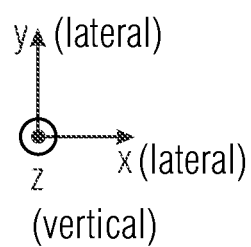
Fig. 4b

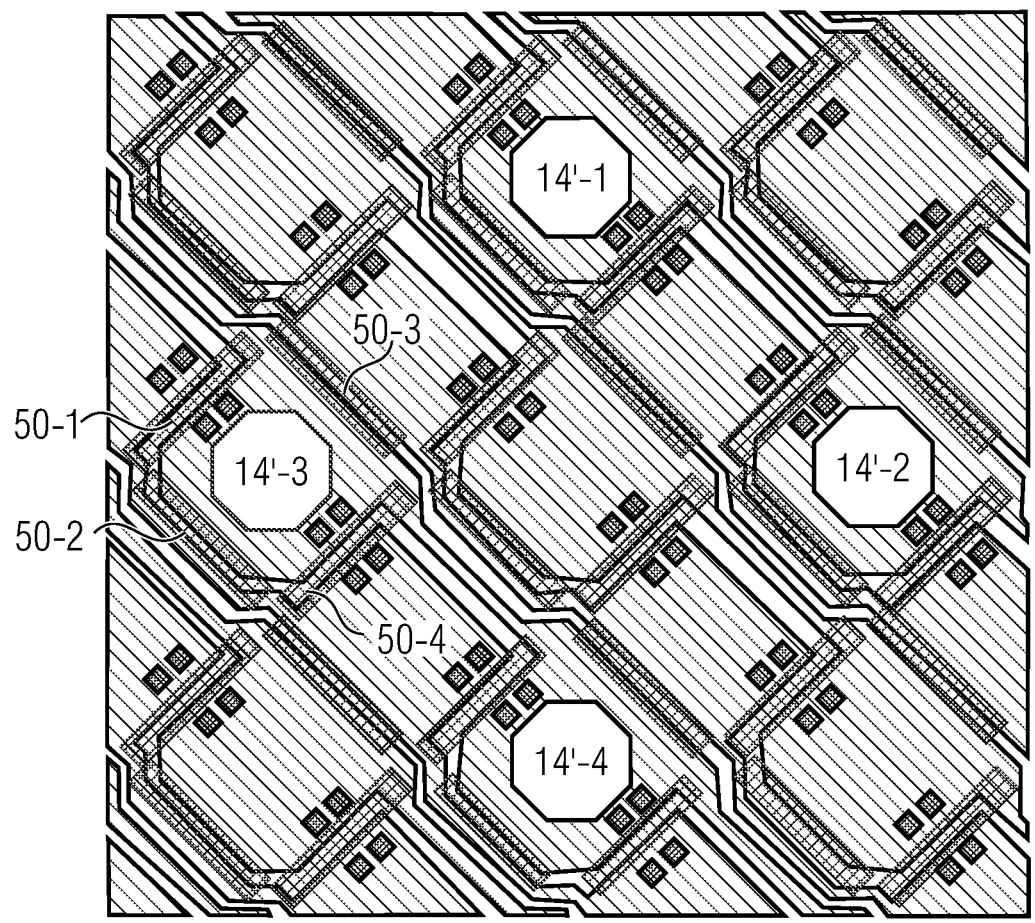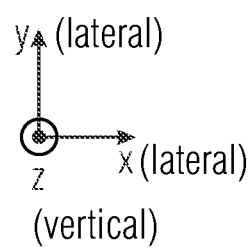
Fig. 4c

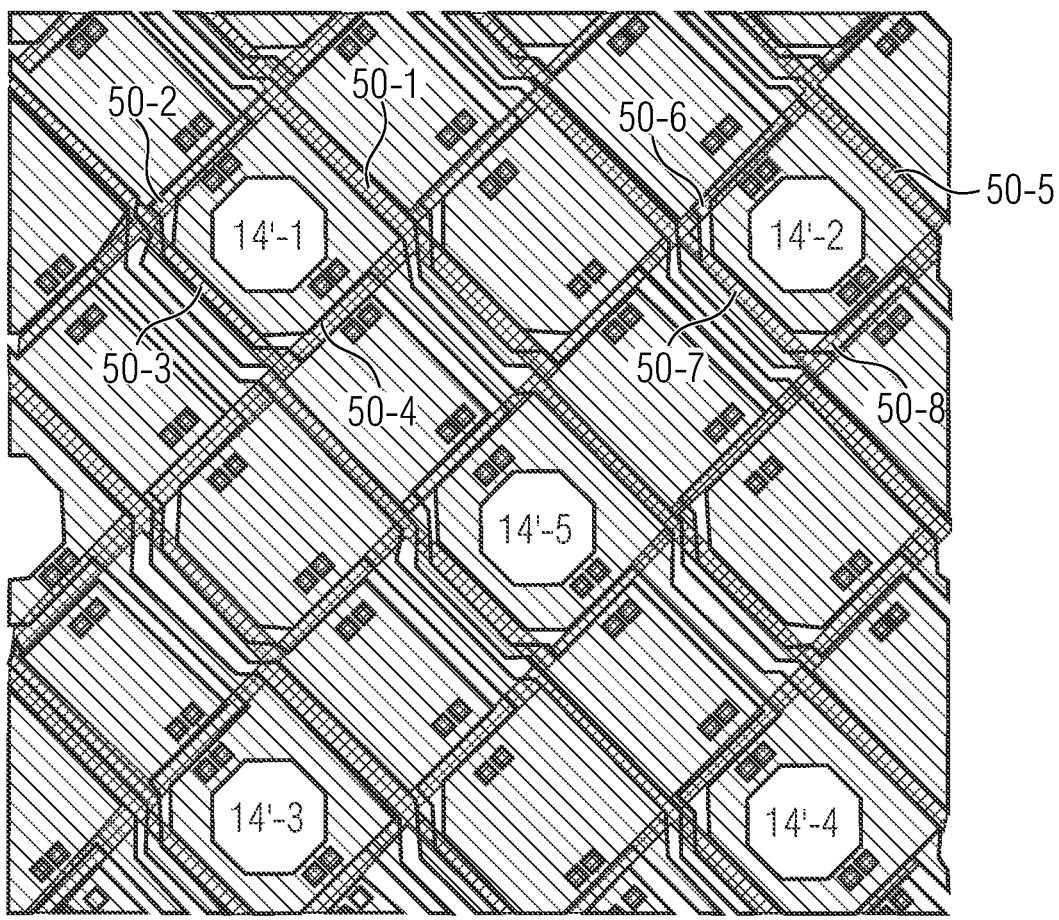
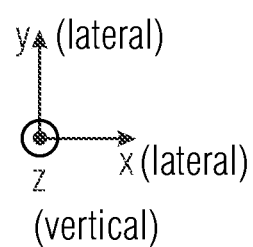
Fig. 4d

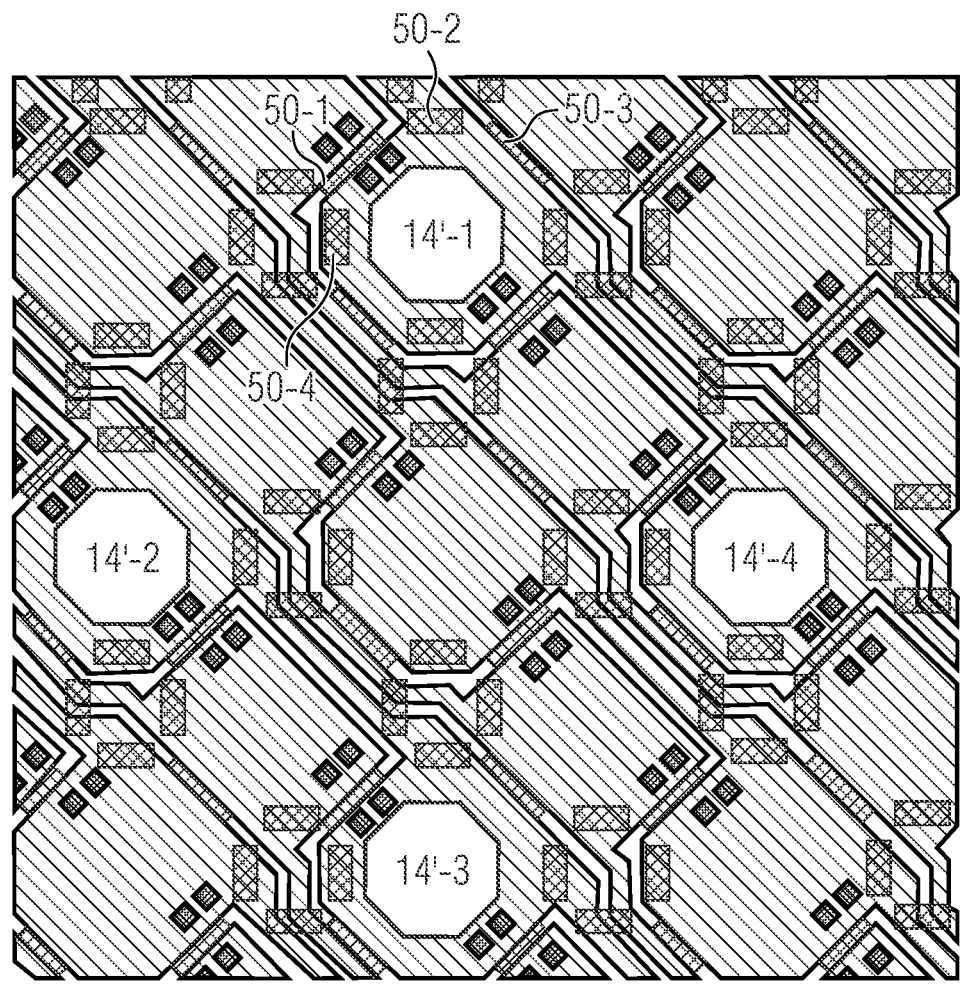
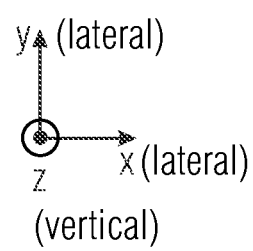
Fig. 4e

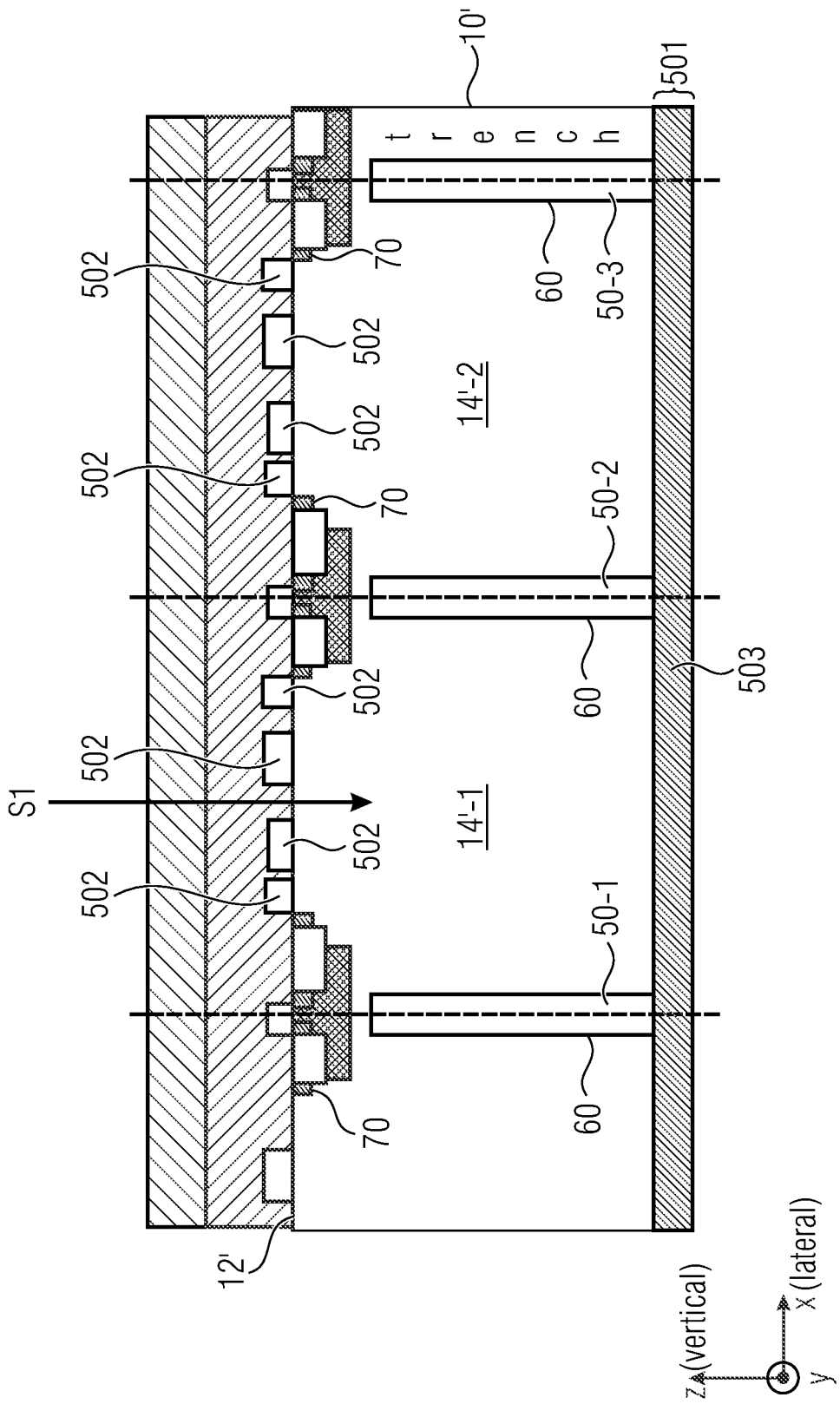

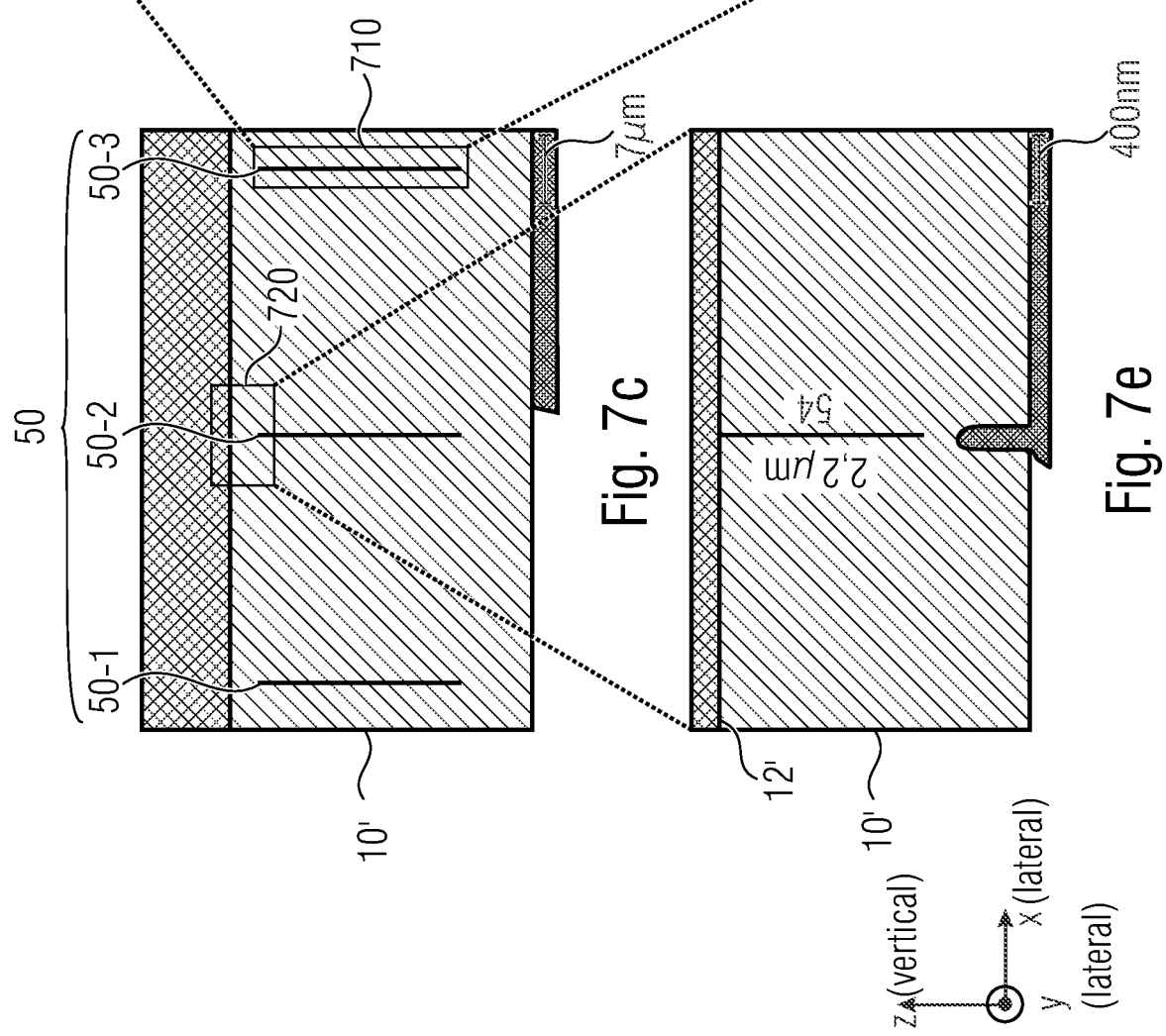

METHOD FOR MANUFACTURING A SENSOR DEVICE WITH A BURIED DEEP TRENCH STRUCTURE AND SENSOR DEVICE

TECHNICAL FIELD

Embodiments of the present disclosure relate to the field of manufacturing sensor devices in a semiconductor substrate. More specifically, embodiments relate to the field of manufacturing sensor devices with a buried deep trench structure, being particularly beneficial in the field of optical sensor devices, such as image sensor arrays or time of flight sensors, by providing a crosstalk prevention and drift field generation.

BACKGROUND

Photosensitive components have become an indispensable part of the semiconductor market. These chips, such as optical sensors, are becoming smaller and have to achieve the required luminous efficacy even with a significantly reduced surface area. For image sensor arrays it is very important to suppress crosstalk between the individual pixels of the array, in particular for small pixels or in the case of high pixel densities. Therefore, deep trenches can be used to prevent optical and electrical crosstalk between the pixels. Deep trenches can be processed from the wafer front side, for example a front side of a semiconductor substrate, with the drawback of surface area consumption. Alternatively, trenches can be processed from the backside of the semiconductor substrate, resulting in a more cost intensive process Furthermore, for example in time of flight sensor devices, electrical drift fields are needed to accelerate generated charge carriers, for example electrons or holes. This can be done by special arrangements of doping profiles, leading to cost intensive process sequences. The doping profiles may be introduced into the semiconductor substrate by a sequence of epitaxial depositions, ion implantations and temperature processes. These processes are complicated, expensive and little reproducible.

Therefore, there is a need for a new method for efficiently manufacturing sensor devices having an effective crosstalk prevention and drift field generation.

Such a method is provided by the method for manufacturing a sensor device with a buried deep trench structure according to claim 1. In addition, specific implementations of different embodiments of the method for manufacturing a sensor device are defined in the dependent claims.

SUMMARY

According to an embodiment, a method for manufacturing a sensor device with a buried deep trench structure comprises: providing a semiconductor substrate having a sensing region, which extends vertically below a main surface region of the semiconductor substrate into the semiconductor substrate, wherein a masking layer is arranged on the main surface region of the semiconductor substrate; etching a deep trench structure into the semiconductor substrate through revealed areas of the masking layer for arranging the deep trench structure laterally relative to the sensing region and vertically from the main surface region into the semiconductor substrate; selectively depositing by epitaxy a doped semiconductor layer on a surface region of the deep trench structure for providing a coated deep trench structure; at least partially removing the masking layer for revealing the main surface region of the semiconductor substrate; depositing a semiconductor capping layer on the main surface region of the semiconductor substrate, wherein the semiconductor capping layer covers and closes the coated deep trench structure and forms together with the semiconductor substrate a thickened semiconductor substrate having the buried deep trench structure; and out-diffusing dopants of the doped semiconductor layer into the thickened semiconductor substrate wherein the out-diffused dopants provide a trench doping region that extends from the doped semiconductor layer into the semiconductor substrate.

According to a further embodiment, a sensor device with a buried deep trench structure comprises: a semiconductor substrate having a sensing region, which extends vertically below a main surface region of the semiconductor substrate into the semiconductor substrate; a semiconductor capping layer that extends vertically below the main surface region of the semiconductor substrate into the semiconductor substrate; a buried deep trench structure that extends vertically below the capping layer into the semiconductor substrate and laterally relative to the sensing region, wherein the buried deep trench structure comprises a doped semiconductor layer, the doped semiconductor layer extending from a surface region of the buried deep trench structure into the semiconductor substrate; a trench doping region that extends from the doped semiconductor layer of the buried deep trench structure into the semiconductor substrate; electronic circuitry for the sensing region in a capping region of the thickened semiconductor substrate vertically above the buried deep trench structure.

Those skilled in the art will recognize additional features and advantages upon reading the following detailed description, and upon viewing the accompanying drawings.

BRIEF DESCRIPTION OF THE FIGURES

Embodiments of the method for manufacturing a sensor device with a buried deep trench structure are described herein making reference to the appended drawings and figures.

FIGS. 4a-f show schematic top views of semiconductor substrates and manufactured elements of the sensor device according to further embodiments.

FIG. 5 shows a schematic cross-sectional view of a semiconductor substrate and manufactured elements of a sensor device according to an embodiment.

FIGS. 7a-e show cross-sectional electron microscopy images of a semiconductor substrate at different stages of the manufacturing method according to an embodiment.

DETAILED DESCRIPTION

Figure 1:
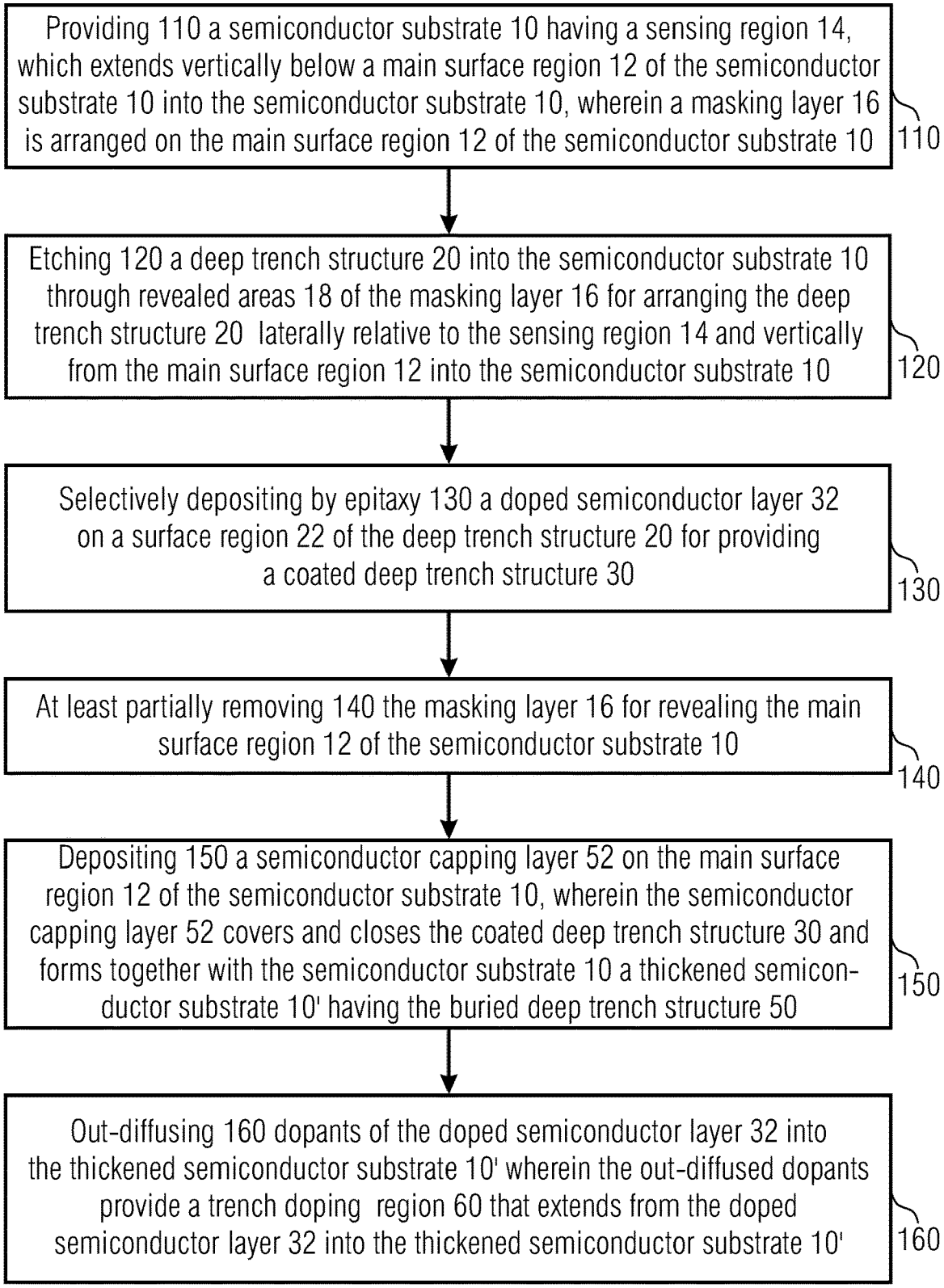
FIG. 1 shows an exemplary process flow (flowchart) of a method for manufacturing a sensor device with a buried trench structure according to an embodiment.

Before discussing the present embodiments in further detail using the drawings, it is pointed out that in the figures and the specification identical elements and elements having the same functionality and/or the same technical or physical effect are usually provided with the same reference numbers or are identified with the same name, so that the description of these elements and of the functionality thereof as illustrated in the different embodiments are mutually exchangeable or may be applied to one another in the different embodiments.

In the following description, embodiments are discussed in detail, however, it should be appreciated that the embodiments provide many applicable concepts that can be embodied in a wide variety of semiconductor devices. The specific embodiments discussed are merely illustrative of specific ways to make and use the present concept, and do not limit the scope of the embodiments. In the following description of embodiments, the same or similar elements having the same function have associated therewith the same reference signs or the same name, and a description of such elements will not be repeated for every embodiment. Moreover, features of the different embodiments described hereinafter may be combined with each other, unless specifically noted otherwise.

It is understood that when an element is referred to as being "connected" or "coupled" to another element, it may be directly connected or coupled to the other element, or intermediate elements may be present. Conversely, when an element is referred to as being "directly" connected to another element, "connected" or "coupled," there are no intermediate elements. Other terms used to describe the relationship between elements should be construed in a similar fashion (e.g., "between" versus "directly between", "adjacent" versus "directly adjacent", and "on" versus "directly on", etc.).

For facilitating the description of the different embodiments, the figures comprise a Cartesian coordinate system x, y, z, wherein the x-y-plane corresponds, i.e. is parallel, to the main surface region of the semiconductor substrate, and wherein the depth direction vertical to the main surface region and into the semiconductor substrate corresponds to the "z" direction, i.e. is parallel to the z direction. In the following description, the term "lateral" means a direction parallel to the x-direction, wherein the term "vertical" means a direction parallel to the z-direction.

The terms "above" or "vertically above" or "top" refer to a relative position located in the vertical direction which extends from the main surface region of the semiconductor substrate and points away from the semiconductor substrate. Similarly, the terms "below" or "vertically below" or "bottom" refer to a relative position located in the vertical direction which extends from the main surface region of the semiconductor substrate and points into the semiconductor substrate.

FIG. 1 and FIGS. 2*a-g* show an exemplary process flow or flowchart of a method 100 of manufacturing a sensor device with a buried trench structure according to an embodiment. In order to facilitate the presentation, the description of FIG. 1 already includes reference numbers of the embodiment shown in FIGS. 2*a-g*. The references numbers relating to FIGS. 2*a-g* are represented by two-digit numbers.

As shown in FIG. 1, the method 100 comprises a step 110 of providing a semiconductor substrate 10, referred to as substrate 10 hereafter for the sake of clarity. The substrate 10 has a sensing region 14, which extends vertically below a main surface region 12 of the substrate 10 into the substrate 10, wherein a masking layer 16 is arranged on the main surface region 12 of the substrate 10. In step 120, a deep trench structure 20 is etched into the substrate 10 through revealed areas 18 of the masking layer 16. The deep trench structure 20 extends vertically from the main surface region 12 into the substrate 10 and is arranged laterally relative to the sensing region 14. The deep trench structure 20 may border the sensing region 14 directly, or may be at a distance from the sensing region 14. In step 130, a doped semiconductor layer 32, referred to as doped layer 32 in the following, is selectively deposited by epitaxy on a surface region 22 of the deep trench structure 20 for providing a coated deep trench structure 30. The doped layer 32 may have a defined thickness and a defined doping concentration. The masking layer 16 prevents the main surface region 12 from being covered with dopants during the selective epitaxial deposition 130. In step 140, the masking layer 16 is at least partially removed for revealing the main surface region 12 of the substrate 10. In step 150, a semiconductor capping layer 52, referred to as capping layer 52 hereafter, is deposited on the main surface region 12 of the substrate 10 to cover and close the coated deep trench structure 30. The capping layer 52 forms together with the substrate 10 a thickened semiconductor substrate 10', referred to as thickened substrate 10' in the following. The thickened substrate 10' has the coated deep trench structure 30 buried therein, i.e. has the buried deep trench structure 50. The buried deep trench structure 50 may be configured to form a barrier to optical and electronic signals. In step 160, dopants of the doped layer 32 are out-diffused into the thickened substrate 10', the out-diffused dopants providing a trench doping region 60 that extends from the doped layer 32 into the thickened substrate 10'.

Thus, embodiments describe a process for manufacturing a sensor device with a buried deep trench structure 50, so that the buried deep trench structure 50 may be etched from a front side of a wafer. The etching 120 of the deep trench structure 20 from the main surface region 12 provides an efficient way to arrange the deep trench structure 20 close by the sensing region 14 which also extends vertically below the main surface region 12. Still, after burying the deep trench structure, the main surface region 12', including regions vertically above the buried deep trench structure 50, is available to be used in the further process steps. This efficiently solves the problem of surface consumption of deep trench structures in sensor devices. In other words, trenches may be etched from the front side, what is an established process, but without any front side area consumption due to an overgrowth, for example with silicon epitaxy. The avoidance of surface area consumption by the deep trenches may be beneficial for a further process flow. For example, electronic circuitry, such as readout circuitry, may be arranged, e.g. placed or manufactured directly, on the main surface region 12' vertically above the buried deep trench structure 50, for example readout circuitry of pixels on the surface, for example of pixel devices forming a part of a sensor device. At the same time, maximizing the amount of available surface area is favorable to the luminous efficacy of an optical sensor. In other words, the presented disclosure uses deep trenches, for example empty deep trenches, with a doping profile and solves the space problem. After closing the deep trenches, an arbitrary semiconductor process flow may be carried out to further process the obtained substrate 10'. The trenches, e.g. of the buried deep trench structure, are closed at the top but may be still empty in the depth, what may give a good characteristic for an optical component of a crosstalk behavior of the sensor device to be manufactured.

For example, the sensing region 14 and a neighboring sensing region within the substrate each form a part of different pixel devices of a sensor device. The deep trench structure may prevent optical and/or electronic crosstalk between the different pixel devices. That is, the deep trench structure 20 may attenuate or prohibit a transfer of an electronic or an optical signal out of the sensing region 14 and/or may attenuate or prohibit a transfer of an electronic or an optical signal into a neighboring region of the substrate, for example a neighboring further sensing region. For example, an electromagnetic signal to be detected in the sensing region 14 may be reflected at the interface between the substrate 10 and the deep trench structure 50. Thus, the electromagnetic signal may remain within the sensing region 14, thus increasing the probability of the electromagnetic signal to be detected in the sensing region 14. Further, due to the reflection of the electromagnetic signal, the electromagnetic signal may be prevented from entering neighboring regions of the substrate. For example, the electromagnetic signal may be prevented from entering a neighboring sensing region, preventing an erroneous or undesirable detection of the electromagnetic signal in another sensing region than the sensing region 14. For example, the reflection of an electromagnetic signal at the interface between the substrate 10 and the deep trench structure 50 may occur due to total internal reflection, such that the electromagnetic signal may be reflected entirely or almost entirely. Further, the deep trench structure 20 may hinder charge carries to move into neighboring regions of the substrate 10. Thus, the deep trench structure 20 increases the probability that a charge carrier is detected within the sensing region 14 within which the charge carrier was generated by conversion of an electromagnetic signal. Thus, the deep trench structure 20 may prevent the charge carrier to be detected erroneously or undesirably in another sensing region than the sensing region 14. Thus, the deep trench structure 20 may increase the yield of an electromagnetic signal entering into the sensing region 14 through a region of the main surface region 12 vertically above the sensing region 14 to be detected in the sensing region 14.

By depositing the doped layer 32 on the surface region 22, such as walls, of the deep trench structure 30, tunable doping profiles for drift field generation can be created in the sensing region 14. Based on the out-diffusing 160 of dopants of the doped layer 32 into the thickened substrate 10', the resulting doping profile can be tuned to provide electric drift fields in the substrate 10' and/or in the sensing region 14, 14'. Thus, the method 100 allows a very precisely reproducible generation of doping profiles with a low complexity process sequence by using a selective epitaxial deposition, for example a high doped selective silicon epitaxy deposition on the trenches, for example on the sidewall of the trenches, and by controlling a doping profile with an annealing process, such as a temperature process.

Thus, the proposed method 100 is an effective method on the way to small pixels, for example small pixels with high resolution which may be part of a sensor device.

In the following, referring to FIGS. 2a-g an exemplary embodiment of the process flow of the method 100 is described. FIGS. 2a-g show schematic cross-sectional views of the substrate along a vertical plane. FIGS. 2a-g show the (at the respective process stage) manufactured elements at several process stages of the method 100 for manufacturing the sensor device.

Figure 2A:
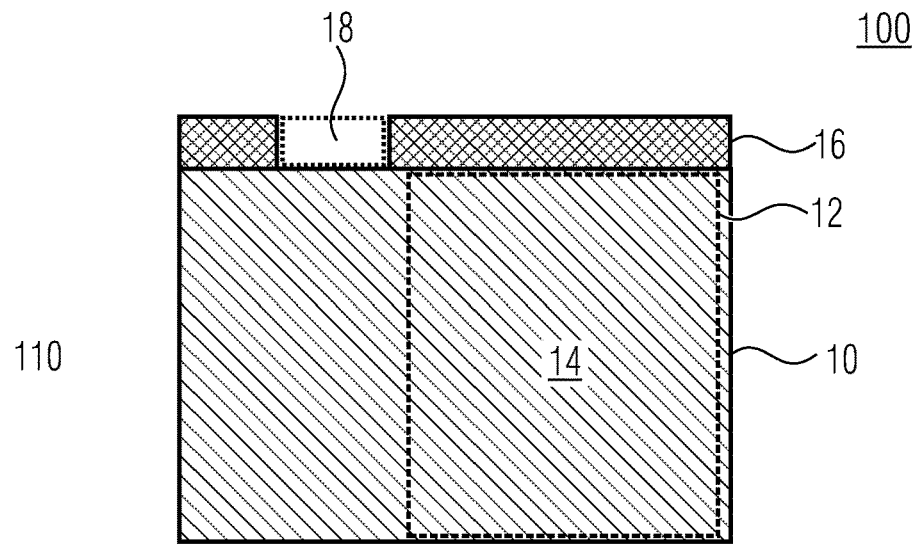
FIGS. 2a-g show schematic cross-sectional views (schematic snapshots) of a semiconductor substrate and manufactured elements of the sensor device at different stages of the manufacturing method according to an embodiment.

FIG. 2a—Provided substrate: FIG. 2a shows an exemplary embodiment of the substrate 10 as provided in step 110 of method 100. The substrate 10 may have a rectangular cross-section along a vertical axis (i.e. in the depth direction or z direction). The substrate 10 may comprise silicon, germanium or any other semiconductor material. The substrate 10 may comprise a bulk or epitaxially (EPI) grown semiconductor material. The substrate 10 may comprise dopants with a doping concentration and a doping type being either n-type or p-type.

The main surface region 12 may be a planar surface and may form a top surface of the substrate 10. The vertical dimension of the sensing region 14 may cover the complete vertical dimension of the substrate 10, or only part of it. The sensing region 14 has a lateral dimension, which may be smaller than the lateral dimension of the substrate 10.

According to an embodiment, the sensing region 14 forms a conversion region of an optical sensor to be manufactured, wherein the conversion region converts an electromagnetic signal into photo-generated charge carriers. A sensing region 14 of such an optical sensor may form part of a device known as pixel, which may comprise further components, e.g. processing circuitry. This pixel itself may form part of a two-dimensional integrated pixel array for receiving electromagnetic radiation, for example optical visible or infrared radiation, wherein the respective pixels provide an electrical output signal according to a parameter to be measured by the optical sensor. The optical sensor may for example be an imaging array or a time of flight sensor.

The revealed areas 18 of the masking layer 16 expose the main surface region 12 of the substrate 10. The lateral structure (i.e. the lateral dimension and the lateral form) of the revealed areas 18 of the masking layer 16 provide a lateral structure for a deep trench structure formed in following process steps. The revealed areas 18 of the masking layer 16 may have been formed by partially removing the masking layer 16. This partial removal of the masking layer 16 may have been performed by a lithographic process.

Figure 2B:
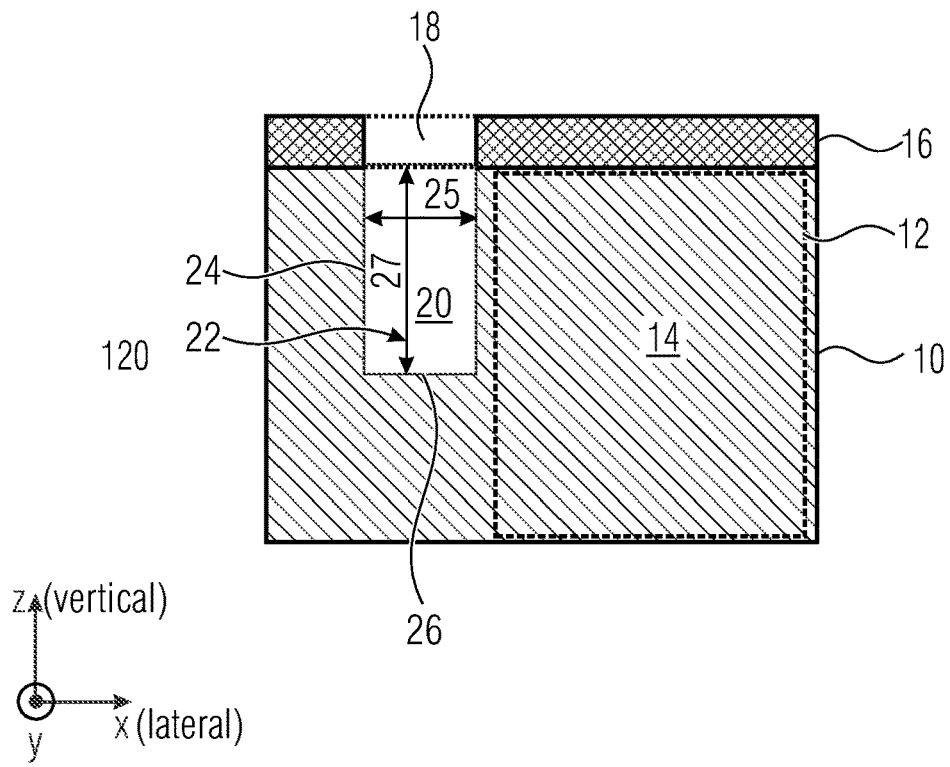

FIG. 2b—trench etching: In step 120 of the method 100, parts of the substrate 10 are removed by etching, starting from the revealed areas 18 of the masking layer 16 and etching into the substrate 10 to form the deep trench structure 20, as shown in FIG. 2b. During the etching process 120, the masking layer 16 may be partially removed. The trench etching process 120 is configured to remove material of the substrate 10 at a faster rate than material of the masking layer 16.

After step 120, the substrate 10 comprises the deep trench structure 20. The lateral structure of the deep trench structure 20 emanates from the lateral structure of the revealed areas 18 of the masking layer 16.

The deep trench structure may have a depth 27. The depth 27 of the deep trench structure 20 may be a vertical dimension of the deep trench structure 20.

According to an embodiment, the depth 27 may be in the range between 1 µm and 100 µm, or in another embodiment, in the range between 2 µm and 20 µm.

The deep trench structure 20 comprises a surface region 22. The surface region 22 of the deep trench structure 20 may be a boundary between the deep trench structure 20 and the substrate 10. The surface region 22 of the deep trench structure 20 may comprise a wall 24, which may be a boundary that confines the deep trench structure 20 in a lateral direction. The surface region 22 of the deep trench structure 20 may also comprise a bottom 26, which may be a boundary that confines the deep trench structure 20 in the vertical direction.

The deep trench structure 20 has a width 25. This width 25 may be a lateral distance between two immediately opposing walls 24, or a lateral distance between two opposite regions of the surface region 22, the lateral distance being measured perpendicular to a longitudinal direction of a trench or a trench portion of the deep trench structure 25.

According to an embodiment, the width 25 is large enough that an evanescent wave of a total internal reflection of an electromagnetic signal at the interface between the substrate 10 and the deep trench structure 20 may be hindered to interact with neighboring regions of the substrate 10. Thus, the reflection may be a frustrated total internal reflection.

According to an embodiment, the width 25 is larger than a few wavelengths of the electromagnetic signal to be detected, such that the reflection of an electromagnetic signal at the interface between the substrate 10 and the deep trench structure 20 may be a frustrated total internal reflection.

A trench aspect ratio of the deep trench structure 20 may be defined as a ratio of the trench height 27 and the width 25. According to an embodiment, the trench aspect ratio of the deep trench structure 20 is in a range between 1 and 100 or between 5 and 60.

The trench etching process 120 may have different etching rates for different etching directions regarding substrate 10. For example, the trench etching process 120 may primarily etch a vertical surface of the substrate 10. Thus, deep trench structures 20 with a high trench aspect ratio may be etched by the trench etching process 120.

The deep trench structure 20 is arranged laterally relative to the sensing region 14 of the substrate 10. The deep trench structure 20 does not necessarily adjoin the sensing region 14, but may also be spaced apart from the sensing region 14 by a region of the substrate 10 which is not part of the sensing region 14.

The deep trench structure 20 may surround, e.g. enclose entirely or only partly the sensing region 14. Optionally, thus, the deep trench structure 20 may enclose the sensing region 14 entirely.

According to an embodiment, the deep trench structure 20 may comprise deep trench portions (not shown in FIGS. 2a-g, see in FIG. 3a for example) which may be arranged to laterally confine the sensing region 14. In such a case, the above described properties of the deep trench structure 20 apply equally to the individual deep trench portions and the arrangement of the plurality of deep trench portions forms the deep trench structure 50.

Figure 2C:
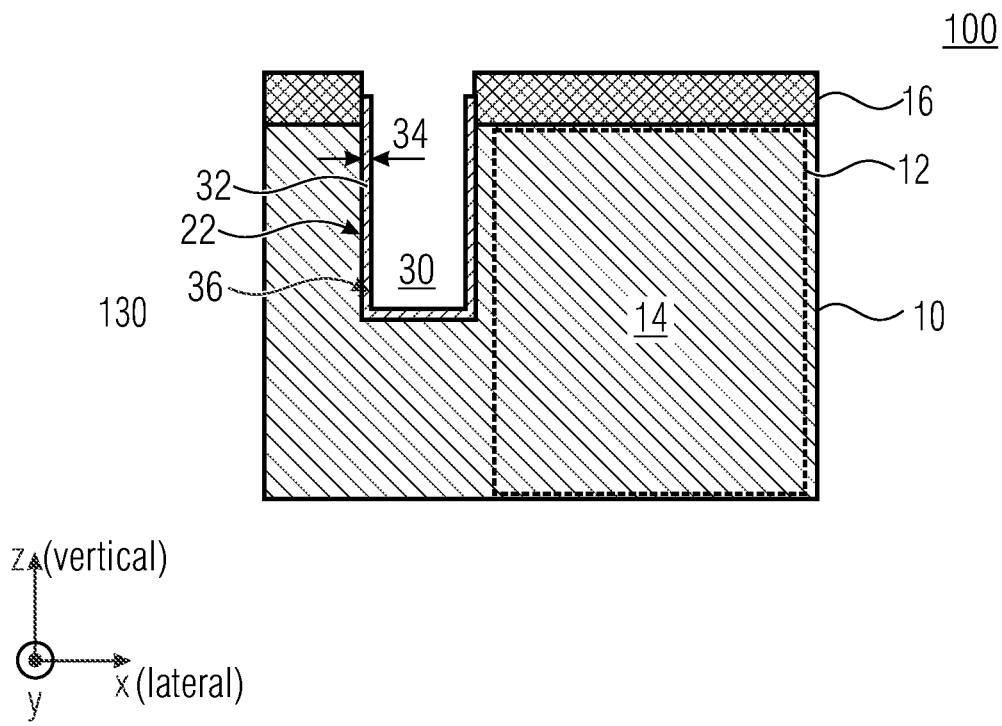

FIG. 2c—doped EPI deposition: In step 130 of the method 100, a doped layer 32 is deposited on the surface region 22 of the deep trench structure 20 by a selective epitaxy (EPI) deposition, as shown in FIG. 2c. The doped layer 32 and the deep trench structure 20 form a coated deep trench structure 30.

The selective epitaxial deposition is configured to selectively deposit a doped semiconductor material primarily on the surface region 22 of the deep trench structure 20.

The deposition of the doped layer 32 on the surface of the deep trench structure 20 is an efficient way to introduce a doping concentration or a doping profile in the substrate. Very reproducible results can be obtained with the control of the thickness and the doping concentration of the doped layer 32.

The selective epitaxial deposition may comprise exposing the substrate 10 to one or more of the following gases: dichlorosilane, HCl, $B_2H_2$, and $H_2$. The selective epitaxial deposition may be performed at a temperature between 600° C. and 1000° C., for example at a temperature around 760° C. The selective epitaxial deposition may be configured to achieve a specific doping concentration of the doped layer 32.

During the selective epitaxial deposition of the doped layer 32, the main surface region 12 of the substrate 10 is still covered by the masking layer 16 to prevent the doped layer 32 from forming thereon.

The doped layer 32 may cover the entire surface region 22 of the deep trench structure 20. The doped layer 32 may comprise a thickness 34. The thickness 34 of the doped layer 32 may be a distance between a surface region 36 of the doped layer 32 and a surface region 22 of the deep trench structure 20. The surface region 36 of the doped layer 32 may be a boundary between the coated deep trench structure 30 and the doped layer 32. The thickness 34 of the doped layer 32 may be in a range between 1 nm and 1 µm.

The doped layer 32 may comprise a semiconducting material, for example silicon. A doping type of the doped layer 32 may be n-type or p-type. A doping concentration of the doped layer 32 may be in a range between $10^{16}$ cm$^{-3}$ and $10^{20}$ cm$^{-3}$.

According to an embodiment, the doping inside the trenches, that is the deposition of the doped layer 32, is done with a selective high doped silicon epitaxial deposition with the masking layer 16, which may be a capping layer, on the main surface region 12.

According to an embodiment, the material deposited by the selective epitaxial deposition is primarily in the deep trench structure 20 and not on the main surface region 12 of the substrate 10.

According to an embodiment, the doped layer 32 is deposited on the trench wall by a selective epitaxial deposition and the doped layer 32 is a thin layer and has a high doping concentration. Thus, the width 25 remains almost unaltered after deposition of the doped layer 32, so that the deep trench structure 20 keeps its beneficial properties regarding crosstalk prevention, and at the same time, an efficient drift field generation is granted.

Figure 2D:
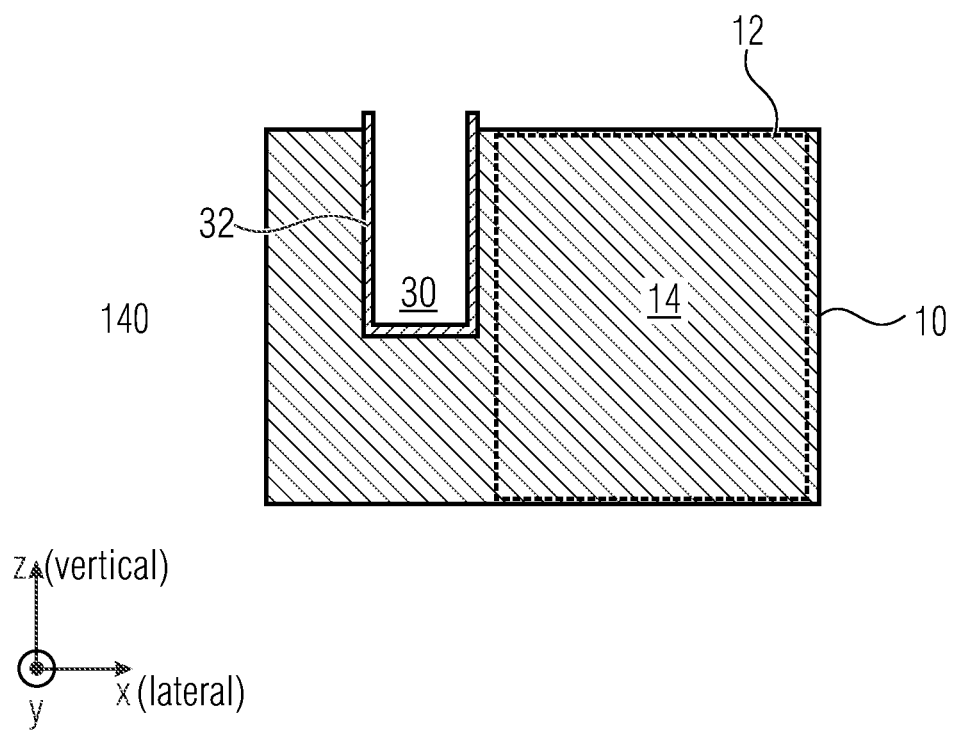

FIG. 2d—pad etching: In step 140 of the method 100, the masking layer 16 is at least partially removed for revealing the main surface region 12 of the substrate 10. The removing 140 of the masking layer 16 may comprise an etching process, wherein the etching process is adapted to etch primarily the masking layer 16 and to etch less efficiently or not at all the substrate 10. The removing 140 of the masking layer 16 may be applied to the entire masking layer 16 or only to parts of the masking layer 16, referring to a lateral dimension of the masking layer 16. The removing 140 of the masking layer 16 removes at least parts of the masking layer 16 in its entire vertical dimension, so that the underlying main surface region 12 of the substrate 10 is exposed. Thus, the removing 140 of the masking layer 16 at least partially exposes the main surface region 12 of the substrate 10.

According to an embodiment, the removing 140 of the masking layer 16 exposes those parts of the main surface region 12 of the substrate 10, which are arranged adjacent to the coated deep trench structure 30.

According to a further embodiment, the removing 140 of the masking layer 16 exposes the entire main surface region 12 of the substrate 10.

After step 140, the main surface region 12 of the substrate 10 is at least partially exposed as shown in FIG. 2d.

After step 140 and before step 150, the method 100 may optionally comprise filling the coated deep trench structure 30 with a gas or with a dielectric material. The optional gas or dielectric material filling the coated deep trench structure 30 may be a material which is opaque for an optical radiation, in particular for an optical radiation to be detected in the sensing region 14. In other words, the gas or the dielectric material filling the coated deep trench structure 30 may be adapted to absorb or attenuate optical radiation, i.e. electromagnetic radiation, or may be chosen so that the optical radiation is refracted at least partially to not pass through the material. Alternatively, the optional gas or dielectric material filling the coated deep trench structure 30 may have a dielectric function adapted to achieve a total internal reflection or a frustrated total internal reflection of an electromagnetic signal at an interface between the coated deep trench structure 30 and the substrate 10.

Figure 2E:
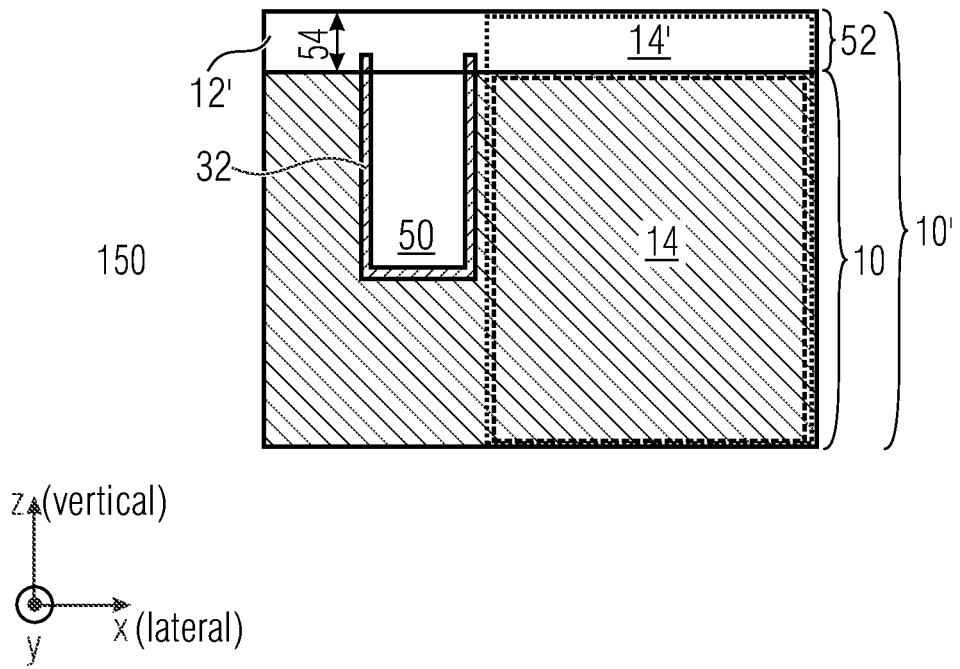

FIG. 2e: capping layer deposition: In step 150 of method 100, the capping layer 52 is deposited on the main surface region 12, as shown in FIG. 2e. The capping layer 52 is also deposited adjacent to the coated deep trench structure 30, more specifically in a region located vertically above the coated deep trench structure 30. Thus, the capping layer 52 covers and closes the coated deep trench structure 30, which is thus buried in the substrate 10 during step 150. The deposition 150 of the capping layer 52 may comprise an epitaxial (EPI) process, such as an epitaxial (EPI) overgrow. In one embodiment, the deposition of the semiconducting capping layer 52 comprises an epitaxial (EPI) overgrow process at atmospheric pressure.

The capping layer 52 may comprise silicon, germanium or any other semiconducting material. In one embodiment, the capping layer 52 has the same material as the substrate 10. The capping layer 52 may comprise a doping concentration and a doping type, which may be n-type or p-type. The doping type of the capping layer 52 may have the same or a different doping type as the substrate 10.

The capping layer 52 and the substrate 10 form a thickened substrate 10' comprising a surface region 12', which may form a top surface of the thickened substrate 10'.

The capping layer 52 has a thickness 54, which may be a vertical distance between the surface region 12' of the thickened substrate 10' and the main surface region 12 of the substrate 10. In other words, the thickness 54 may be a depth of the capping layer 52. Thus, the thickness 54 may also be a depth of the buried deep trench structure 50 below the main surface region 12' of the thickened substrate 10'. The capping layer 52 may cover the main surface region 12 of the substrate 10 partially or completely. The capping layer 52 may comprise a region, which extends vertically above the sensing region 14 into the capping layer 52, and which may extend the sensing region 14 to form together with it a sensing region 14'. The sensing region 14' extends vertically below the main surface region 12' into the thickened substrate 10'.

The depth of bury 54, that is the thickness of the capping layer 52, may have a chosen value. A thin value of the depth of bury 54 may improve the crosstalk suppression of the buried deep trench structure 50. A thick value of the depth of bury 54 may provide more space for processing electronic circuitry vertically above the buried deep trench structure 50.

According to an embodiment, the thickness 54 of the capping layer 52 may be in a range between 100 nm and 10 μm.

According to an embodiment, the buried deep trench structure 50 may be empty or filled with gas or it may be partially filled with a dielectric material or with any other material. In this context, empty may refer to a filling with any gas, for example air or a process gas, or empty may refer to a gaseous environment at a pressure lower than ambient pressure. Alternatively, the buried deep trench structure 50 may be filled or partially filled with a solid material, for example a dielectric material.

According to an embodiment, the buried deep trench structure 50 is filled with a process gas of the epitaxial overgrow process.

According to an embodiment, the deposition of the capping layer 52 may comprise depositing semiconducting material on the surface region 36 of the doped layer 32, so that the capping layer 52 may at least partially cover the doped layer 32.

The buried deep trench structure 50 emanates from the coated deep trench structure 30 which itself results from the deep trench structure 20. Thus, properties and functions of the deep trench structure 20 discussed above equally apply to the buried deep trench structure 50. Properties and functions discussed in the context of the interface between the deep trench structure 20 or the coated deep trench structure 30 and the substrate 10 equally apply regarding the interface between the buried deep trench structure 50 and the substrate 10.

According to an embodiment, and resulting from what is indicated above, the buried deep trench structure 50 may comprise multiple deep trench portions (not shown in FIG. 2, shown in FIGS. 3b-d, FIGS. 4a-f, FIG. 5) to which, the above described properties of the buried deep trench structure 50 apply equally.

Figure 2F:
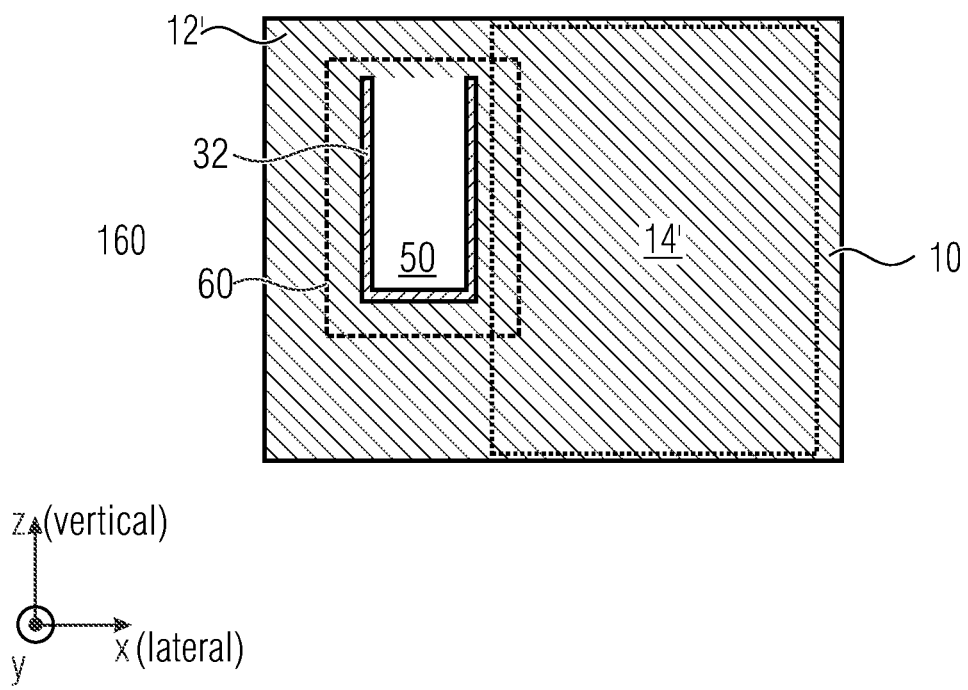

FIG. 2f—dopant out-diffusion: In step 160 of method 100, dopants of the doped layer 32 are out-diffused into the thickened substrate 10'. The step of out-diffusing may comprise an annealing process, which may be a temperature process, which may comprise exposing the device with the substrate 10 to a high temperature. The out-diffusing of dopants comprises a drift or a movement of dopants from the doped layer 32 into the thickened substrate 10'. The region, within which the dopants are distributed forms a trench doping region 60, as shown in FIG. 2f. The out-diffusion 160 of dopants establishes a doping profile 74 that extends from the doped layer 32 into the thickened substrate 10'.

The doping profile 74 describes the local distribution of dopants in the trench doping region 60. The trench doping region 60 may be laterally adjacent to the sensing region 14', but the trench doping region may also overlap with the sensing region 14'. The trench doping region 60 may also laterally confine the sensing region 14'.

The out-diffusing 160 may be adapted to control the drift or the movement of dopants, such that after the step 160, the trench doping region 60 comprises a specific dimension and/or form with a specific doping profile 74. The doping profile 74 may be changed to reach an optimum adjustment of the electric fields. A maximum doping concentration may be in a range between $10^{14}$ and $10^{18}$ cm$^{-3}$, or between $10^{15}$ and $10^{17}$ cm$^{-3}$.

According to an embodiment, the doping profile 74 is configured to efficiently separate charge carriers of opposite charge, such as electrons and holes, which were generated by converting an electromagnetic signal into charge carriers.

According to an embodiment, the doping profile 74 is configured to optimize the path of charge carriers towards an electronic contact configured for collecting the charge carrier, so that a readout-speed can be enhanced.

According to an embodiment, the doping profile 74 is configured to efficiently accelerate charge carriers away from the interface between the buried deep trench structure 50 and the substrate 10', so that a leakage is reduced. The leakage may for example be a recombination of charge carriers at interface between the buried deep trench structure 50 and the substrate 10'.

Figure 2G:
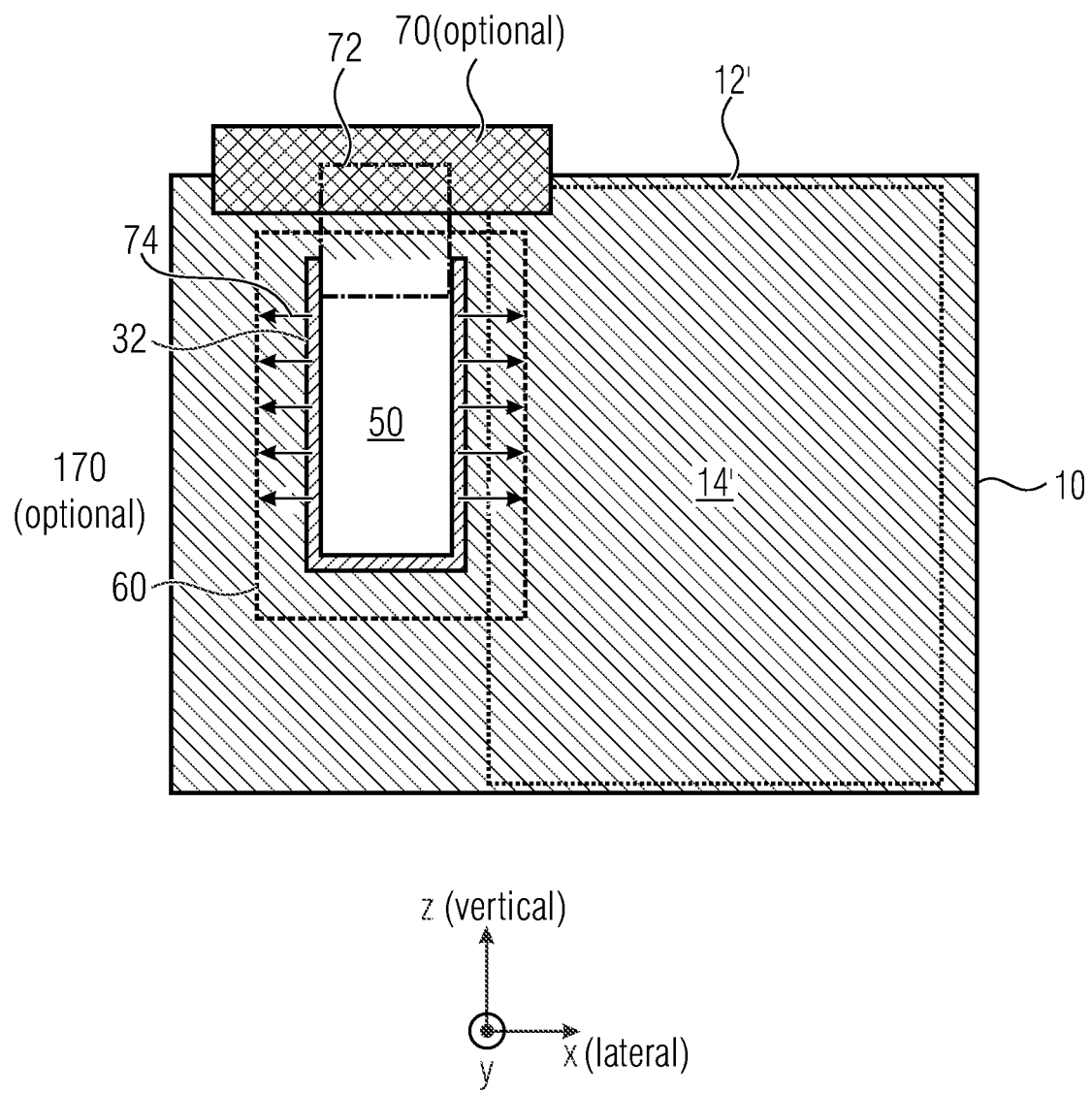

FIG. 2g—optional electronic circuitry: As shown in FIG. 2g, in an optional step 170, an electronic circuitry 70, such as a readout circuitry, for the sensing region 14' may be created at least partially vertically above the buried deep trench structure 50. The circuitry may at least in part be located within a capping region 72 of the thickened substrate 10', or alternatively, may be located on the top surface of the thickened substrate 10'. The creation of the circuitry 70 may comprise a sequence of process steps, including, for example, one or several of depositing a material, removing a material, doping a material or treating a material chemically or mechanically. During creation of the electronic circuitry 70, the thickened substrate 10' may be changed or affected by a process step.

The capping region 72 extends vertically above the buried deep trench structure 50 into the thickened substrate 10' and to the main surface region 12' and it may exceed the main surface region 12' to extend vertically above the main surface region 12'. Creating the electronic circuitry 70 affects the capping region 72, in particular a part of the main surface region 12' within the capping region 72. The electronic circuitry 70 may extend vertically above and/or below the main surface region 12' of the thickened substrate 10'. The electronic circuitry 70 may extend into the capping region 72 and/or into the sensing region 14'. The electronic circuitry may also extend into the trench doping region 60.

According to an embodiment, the electronic circuitry is arranged partially within the thickened substrate 10'. Such an arrangement facilitates the fabrication of common semiconductor circuitry, for example doping regions for read-out contacts.

According to an embodiment, the electronic circuitry 70 may comprise contact regions within the thickened substrate 10'. The contact region may for example comprise a higher doping concentration of the same doping type as the sensing regions 14' so that charge carriers from the sensing regions 14'-1, 14'-2 may be collected in the contact regions.

According to an embodiment, the electronic circuitry 70 is a readout circuitry to collect electronic charges from the sensing region 14'.

According to an embodiment, the sensing region 14' and the electronic circuitry 70 form parts of a pixel device which is part of a sensor device comprising multiple pixel devices. The multiple pixel devices may be separated from each other by the buried deep trench structure 50. More specifically, an individual pixel device of the multiple pixel devices may be separated from its neighboring pixel devices by one ore multiple deep trench portions of the buried deep trench structure 50.

According to an embodiment, electronic circuit paths are placed in regions located vertically above the buried deep trench structure.

In the following, a number of different possible implementations of the method 100 are exemplarily described.

In the present description of embodiments of the method 100, the same or similar elements having the same structure and/or function are provided with the same reference numbers or the same name, wherein a detailed description of such elements will not be repeated for every embodiment. Thus, the above description with respect to FIGS. 1a and 2a-g is equally applicable to the further embodiments as described below. In the following description, essentially the differences, e.g. additional elements, to the embodiment as shown in FIG. 1a and FIGS. 2a-g and the technical effect(s) resulting therefrom are discussed in detail.

FIGS. 3a-d show schematic top views (schematic snapshots) of substrates 10, 10' and manufactured elements of sensor devices at two different stages of the method 100 according to embodiments.

Figure 3A:
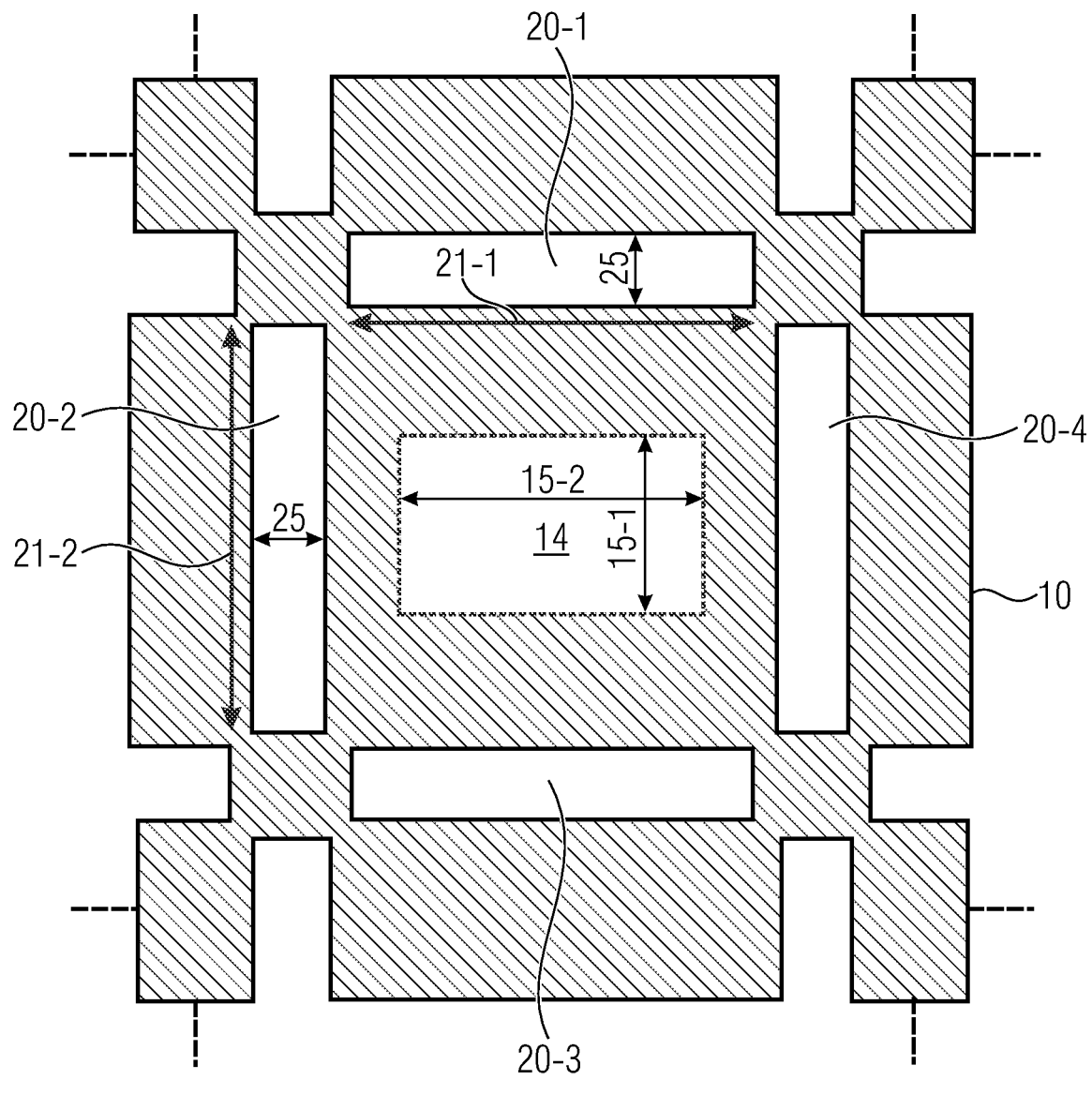
FIGS. 3a-d show schematic top views of a semiconductor substrate and manufactured elements of the sensor device at different stages of the manufacturing method according to an embodiment.

FIG. 3a refers to the step 120 of etching the deep trench structure 20 into the substrate 10, as also described in the description of FIG. 2b.

According to an embodiment, the deep trench structure 20 may comprise a plurality of deep trench portions 20-1, 20-2, . . . , 20-n, e.g. four deep trench portions 20-1, 20-2, . . . , 20-4 as shown in FIG. 3a. Each of the deep trench portions 20-1, 20-2, . . . , 20-n may comprise an individual width and depth. For example, the deep trench portions 20-1, 20-2, . . . 20-4 may have a common width 25, which is referred to as the width 25 of the deep trench structure 20. According to the embodiment, the individual deep trench portions 20-1, 20-2, . . . , 20-4 may have a common depth, which is referred to as the depth 27 of the deep trench structure (cf. FIG. 2b). A deep trench portion 20-1, 20-2, . . . , 20-n may have a length 21-1, 21-2, . . . , 21-n, which is a longitudinal dimension of the deep trench portion 20-1, 20-2, . . . , 20-n perpendicular to the width 25 of the respective deep trench portion 20-1, 20-2, . . . , 20-n. Each deep trench portion 20-1, 20-2, . . . 20-n may comprise an individual length 21-1, 21-2, . . . , 21-n. For example, as shown in FIG. 3a, the deep trench portions 20-1, 20-2 may comprise the lengths 21-1, 21-2. The deep trench portions 20-1, 20-2, . . . 20-n may be arranged to partially or completely laterally surround the sensing region 14, as indicated above. For example, as shown in FIG. 3a, the four deep trench portions 20-1, 20-2, . . . 20-4 may partially surround the sensing region 14. According to the embodiment, two neighboring deep trench portions of the deep trench portions 20-1, 20-2, . . . 20-4 are arranged at an angle of 90°, the four deep trench portions 20-1, 20-2, . . . 20-4 being arranged in a rectangle configuration.

According to an embodiment, the deep trench portions 20-1, 20-2, . . . 20-n may be arranged in an equiangular polygon configuration, so that two of the n deep trench portions 20-1, 20-2, . . . 20-n may be arranged at an angle of 360°/n.

According to an embodiment, the deep trench portions 20-1, 20-2, . . . 20-n may be arranged in arbitrary sequence at arbitrary angles to partially or completely laterally surround the sensing region 14.

The sensing region 14 may have an arbitrary lateral form. The lateral dimension of the sensing region 14 may be defined by one ore multiple lateral sensing region dimensions. For example, according to the embodiment shown in FIG. 3b, the lateral form of the sensing region 14 is rectangular and is defined by two lateral sensing region dimensions 15-1, 15-2.

Figure 3B:
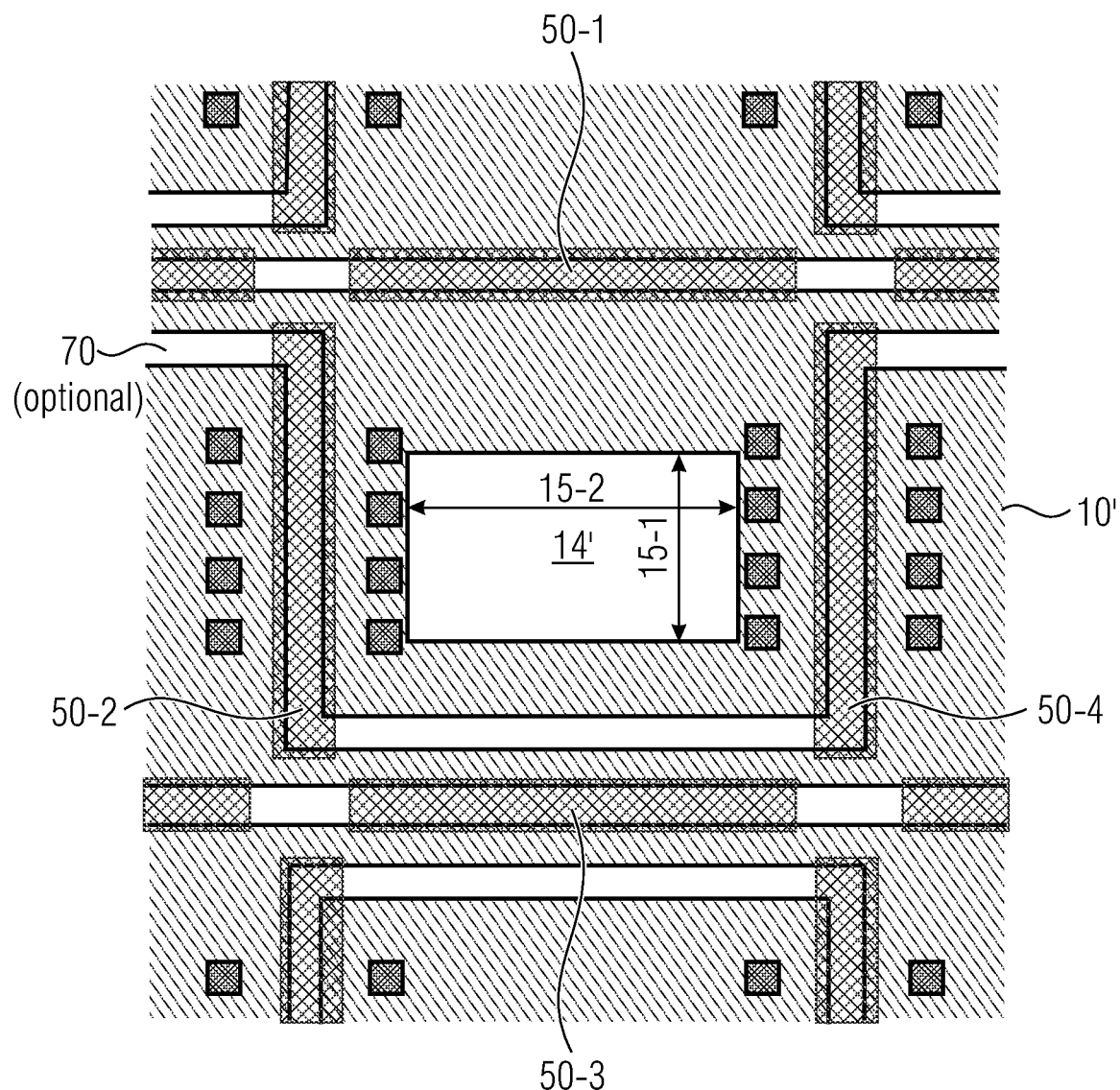
Figure 3C:
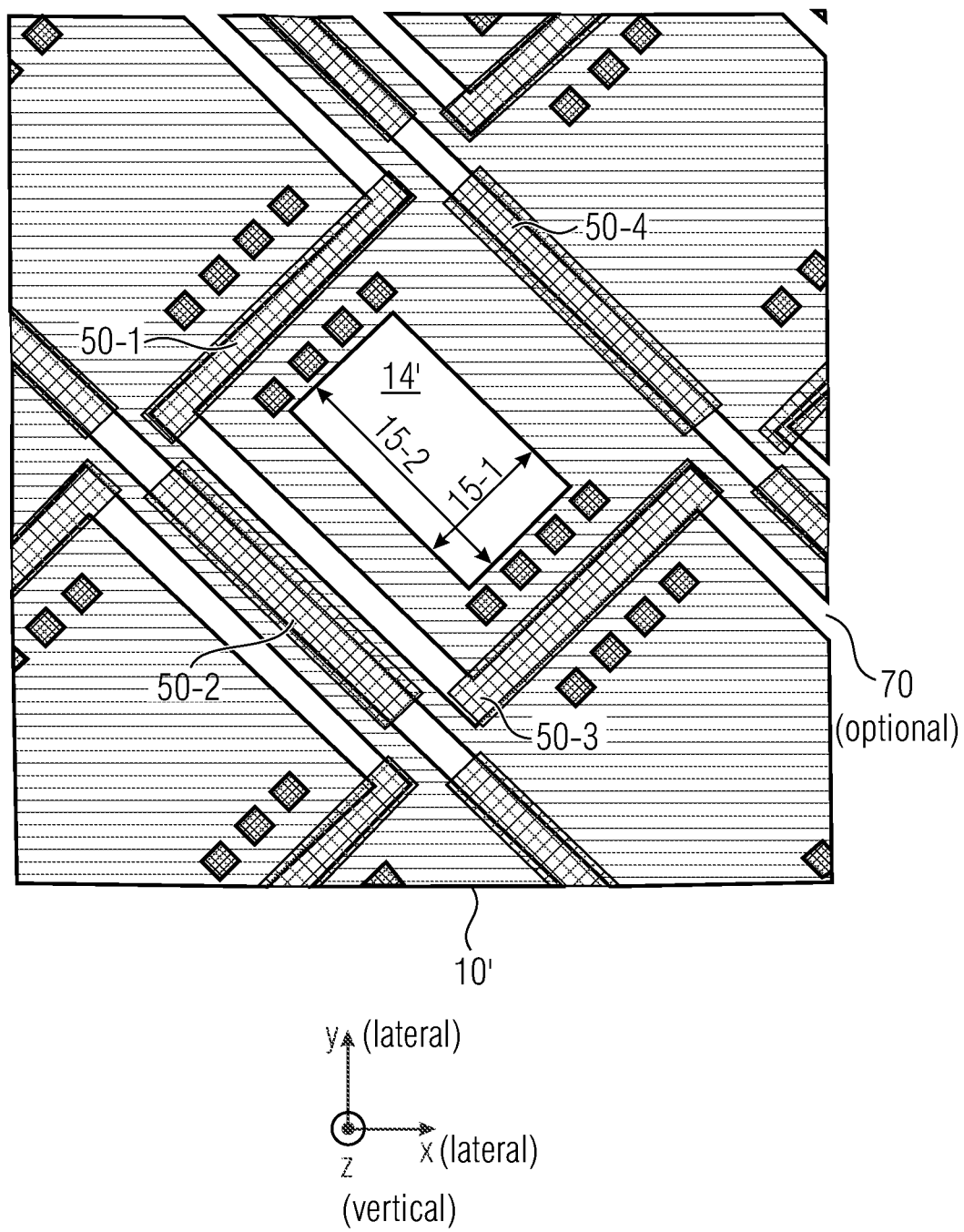
Figure 3D:
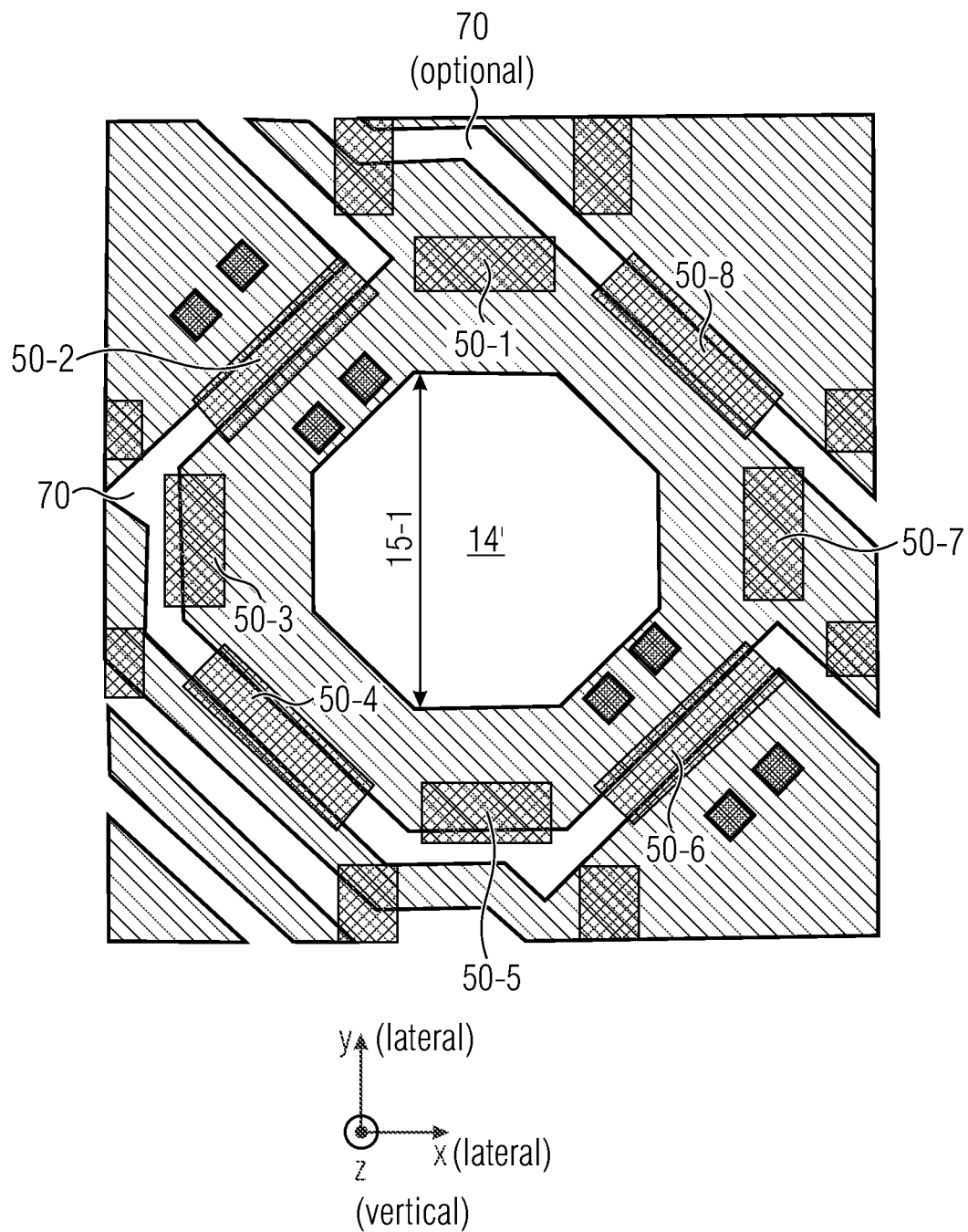

FIGS. 3b-d refer to step 150 of depositing the capping layer 52 for forming the thickened substrate 10' having the buried deep trench structure 50, as also described in the description of FIG. 2e.

According to an embodiment, the buried deep trench structure 50 may comprise a plurality of deep trench portions 50-1, 50-2, . . . , 50-n, which emanate from the deep trench portions 20-1, 20-2, . . . , 20-n etched in step 120.

For example, according to the embodiments shown in FIGS. 3b-c, the buried deep trench structure 50 comprises four deep trench portions 50-1, 50-2, . . . , 50-4, which emanate from the deep trench portions 20-1, 20-2, . . . , 20-4 etched in step 120 (cf. FIG. 3a). The deep trench portions 50-1, 50-2, . . . , 50-4 may be arranged to partially or completely laterally surround the sensing region 14' which may be defined by two lateral sensing region dimensions 15-1, 15-2.

FIG. 3d shows a further embodiment of an arrangement of eight deep trench portions 50-1, 50-2, . . . , 50-8 which are arranged in an octagonal arrangement to partially surround a sensing region 14', wherein the sensing region 14' may have an octagonal form which may be defined by a lateral sensing region dimension 15-1.

As shown in FIGS. 3a-d, the sensing region 14, 14' does not necessarily extend over the entire lateral region between individual deep trench portions 20-1, 20-2, . . . , 20-n, 50-1, 50-2, . . . , 50-n. Thus, the sensing region 14, 14' does not necessarily adjoin the deep trench structure 20 or the buried deep trench structure 50.

According to an embodiment, the sensing region 14' may have an arbitrary form.

According to embodiments, for example embodiments shown in FIGS. 3b-d, an electronic circuitry 70, such as a readout circuitry, may be created for a sensing region 14' at least partially vertically above the buried deep trench structure 50, as described in the description of FIG. 2g.

FIGS. 4a-f show schematic top views of substrates 10' and manufactured elements of sensors device according to different embodiments.

According to the embodiments, the thickened substrate 10' comprises a plurality of sensing regions 14'-1, 14'-2, . . . , 14'-n and the buried deep trench structure 50 comprises a plurality of deep trench portions 50-1, 50-2, . . . , 50-n. The deep trench portions 50-1, 50-2, . . . 50-n may be arranged to partially (FIGS. 4a-c, 4e) or completely (FIGS. 4d, 4f) laterally surround multiple sensing regions 14'-1, 14'-2, . . . , 14'-n individually, i.e. each of multiple parts of the plurality of deep trench portions 50-1, 50-2, . . . , 50-n may be arranged to at least partially surround one of the single sensing regions 14'-1, 14'-2, . . . , 14'-n, respectively. For example, in the exemplary arrangements shown in FIGS. 4a-c, the deep trench portions 50-1, 50-2, . . . , 50-4 partially enclose the sensing region 14'-4.

According to an embodiment, for example the embodiment shown in FIG. 4d, the deep trench portions 50-1, 50-2, . . . , 50-8 are arranged to completely laterally surround multiple sensing regions 14'-1, 14'-2 individually.

Figure 4A:
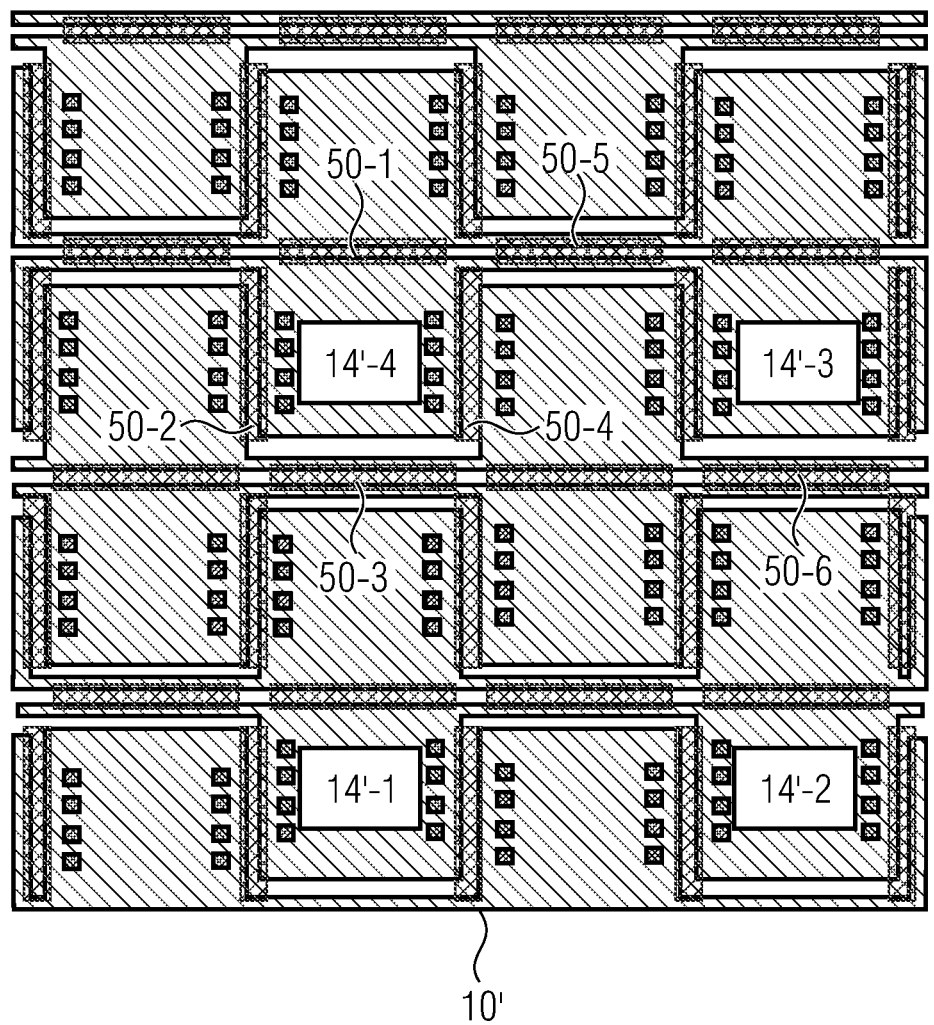
Figure 4F:
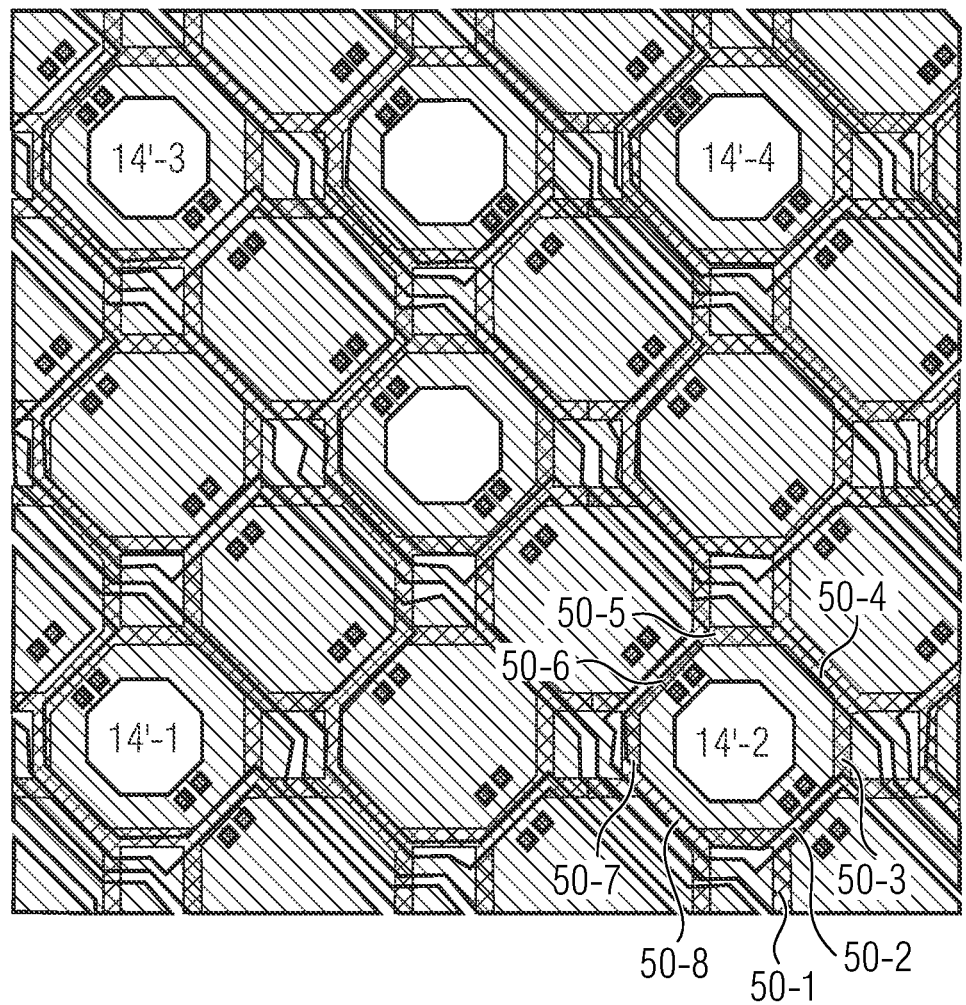

According to an embodiment, for example the embodiment shown in FIG. 4f, the deep trench portions 50-1, 50-2, . . . 50-8 are arranged to completely laterally surround the sensing region 14'-2 individually.

According to an embodiment, a plurality of deep trench portions 50-1, 50-2, . . . 50-n may be arranged to separate individual sensing regions 14'-1, 14'-2, . . . 14'-n from each other.

According to an embodiment, a plurality of sensing regions 14'-1, 14'-2, . . . 14'-n may be arranged in an array.

According to an embodiment, each of a plurality of sensing regions 14'-1, 14'-2, . . . 14'-n forms a part of an individual pixel device, the individual pixel devices being part of an imaging array or a sensor array.

FIG. 5 shows a schematic cross-sectional view of an exemplary embodiment of a thickened substrate 10' and elements of a sensor device manufactured by the method 100 according to an embodiment. The thickened substrate 10' comprises sensing regions 14'-1, 14'-2 to convert an electromagnetic signal S1 into charge carriers, i.e. into electrons and holes. The thickened substrate 10' comprises the buried deep trench structure 50 comprising deep trench portions 50-1, 50-2, 50-3 which are arranged to separate the neighboring sensing regions 14'-1, 14'-2. The deep trench portions 50-1, 50-2, 50-3 are surrounded by the trench doping region 60. The trench doping region 60 comprises a doping profile which may be optimized to accelerate charge carriers away from the interface between the buried deep trench portions 50-1, 50-2, 50-3, efficiently reducing leakage or noise of the manufactured sensor device during operation.

The electronic circuitry 70 is partially arranged vertically above the deep trench portions 50-1, 50-2, 50-3 so that the buried deep trench structure 50 does not consume surface area.

According to an embodiment, additional readout circuitry 502 is arranged on a main surface region 12' of the thickened substrate 10' vertically above the sensing regions 14'. The additional readout circuitry 502 may be adapted to perform time of flight measurements.

According to an embodiment, the thickened substrate 10' comprises a buried doping region 501 which extends vertically below the sensing regions 14'-1, 14'-2 into the substrate 10'. In an embodiment, the buried doping region 501 extends vertically below the sensing regions 14'-1, 14'-2 to an opposite surface region 503 of the thickened substrate 10' opposite to the main surface region 12'.

According to an embodiment, the buried doping region 501 comprises an opposite doping type compared to the sensing region 14, i.e. the buried doping region 501 may comprise a p-type doping and the sensing region 14 may comprise a n-type doping or vice versa. Such an embodiment may be beneficial for efficiently separating electrons and holes.

According to an embodiment, the trench doping region 60 comprises the same doping type as the buried doping region 501 of the substrate 10, so that a specific kind of charge carriers is efficiently accelerated towards the main surface region 12' or an electronic circuitry 70.

According to an embodiment, the trench doping region 60 comprises a higher doping concentration than the buried doping region 501.

According to an embodiment, the trench doping region 60 and the buried doping region 501 are p-doped and the sensing region is n-doped, the embodiment being beneficial for an efficient drift of electrons towards the main surface area 12 of the substrate and in particular for an efficient drift of electrons towards the electronic circuitry 70 and/or the additional readout circuitry 502.

In an embodiment, the etching 120 of the deep trench structure 20 may comprise arranging the deep trench structure 20 vertically from the main surface region 12 into the substrate 10 and into a buried doping region 501 of the substrate 10.

According to an embodiment, the doped layer 32 (see for example FIGS. 2c-g) may comprise the same doping type as the buried doping region 501 of the substrate 10.

According to an embodiment, the doped layer 32 (see for example FIGS. 2c-g) further comprises a higher doping concentration than the buried doping region 501.

According to an embodiment, the doped layer 32 (see for example FIGS. 2c-g) and the buried doping region 501 are p-doped and the sensing region is n-doped.

Figure 6:
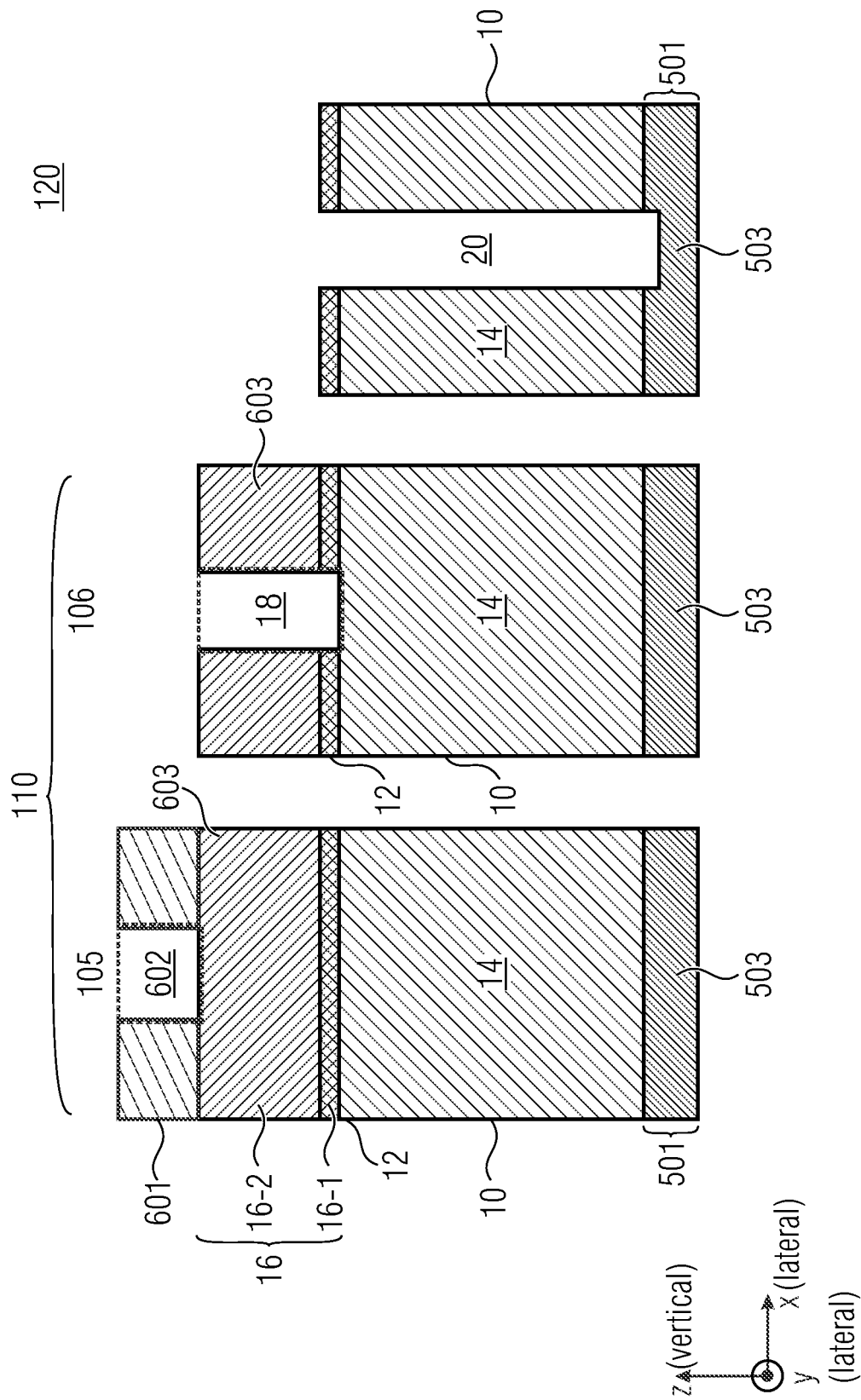
FIG. 6 shows schematic cross-sectional views (schematic snapshots) of a semiconductor substrate and elements of the manufactured sensor at different stages of the manufacturing according to a further embodiment.

FIG. 6 shows schematic cross-sectional views (schematic snapshots) of a substrate 10 and manufactured elements of a sensor device at different stages of the method 100 according to a further embodiment. FIG. 6 refers to the optional steps 105 and 106 and the steps 110 and 120 of an embodiment of the method 100. Equal elements shown in different panels of the figure should be referred to with the same references if not indicated otherwise.

The optional step 105 may be part of the step 110. In step 105, the substrate 10 is provided with the sensing region 14, and with the masking layer 16 arranged on the main surface region 12. In the shown embodiment, the masking layer 16 comprises a pad layer 16-1 arranged adjacent to or on top of the main surface region 12. According to an embodiment, the pad layer 16-1 may be a silicon nitride layer. In the shown embodiment, the masking layer 16 further comprises a hard mask layer 16-2 arranged adjacent to or on top of the pad layer 16-1. The hard mask layer 16-2 may comprise a composition of materials, which is less sensitive to a specific etch process than a composition of material of the substrate 10. Thus, an etch process may be configured to remove material of the substrate 10 at a faster rate than material from the hard mask layer 16-2. In the shown embodiment, a resist layer 601 is arranged on top of the hard mask layer 16-2. The resist layer 601 comprises a revealed resist region 602 which exposes a top surface region 603 of the hard mask layer 16-2, as shown in the left panel of FIG. 6. For the providing 110 of the substrate 10, in this embodiment, the method 100 comprises an additional step 106 of etching revealed areas 18 into the masking layer 16 through the revealed resist region 602 of the resist layer 601. Thus, the lateral structure of the revealed areas 18 of the masking layer 16 emanate from the revealed region 602 of the resist layer 601. The step 106 of etching the masking layer 16 may be followed by or may comprise removing the resist layer 601, so as to provide the substrate 10 with the masking layer 16 comprising the revealed areas 18, as shown in the center panel of FIG. 6. The right panel of FIG. 6 shows the result of the etching 120 of the deep trench structure 20.

According to an embodiment, the optional pad layer 16-1 has a thickness, which is a vertical dimension, in the range between 1 nm and 10 µm or in another embodiment in the range between 10 nm and 1 µm.

According to an embodiment, the masking layer 16 comprises a pad layer 16-1 and a hard mask layer 16-2, wherein the hard mask layer 16-2 is configured to be less sensitive to a trench etch process than the substrate 10, so that the trench etch process primarily affects regions of the substrate 10 which are not covered with the masking layer 16.

Although, the embodiment shown in FIG. 6 comprises the buried doping region 501, as introduced in FIG. 5, this feature is independent from the features introduced in FIG. 6.

FIGS. 7a-e show cross-sectional electron microscopy images and typical dimensions of a substrate 10, 10' at different stages of the method 100 according to an embodiment.

Figures 7A, 7B:
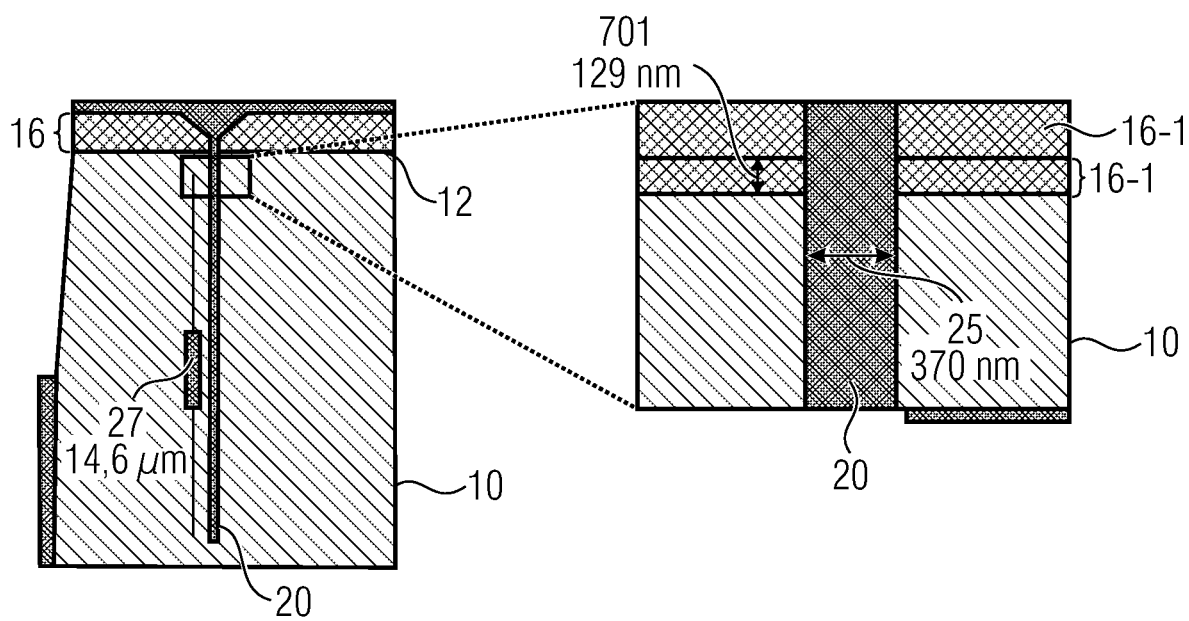

FIG. 7a shows a show cross-sectional view of a substrate 10 with the masking layer 16 after the etching 120. The deep trench structure 20 comprises a depth 27 which is a vertical dimension from the main surface region 12 into the substrate 10. The depth 27 may be in the range as described in the context of FIG. 2b. For example, the depth 27 may be around 15 µm.

FIG. 7b shows an enlarged view of the rectangle in FIG. 7a. According to the shown embodiment, the masking layer 16 comprises a pad layer 16-1 and a hard mask layer 16-2, the pad layer 16-1 having a thickness 701. The thickness 701 of the pad layer 16-1 may be in a range as described in the context of FIG. 2a. For example, the pad layer thickness 701 may be around 130 nm. The deep trench structure 20 may have a width 25 which may be in the range as described in the context of FIG. 2b. For example, the width may be around 370 nm.

FIG. 7c shows a cross-sectional view of a thickened substrate 10' having the buried deep trench structure 50 after step 150. The buried deep trench structure 50 comprises the deep trench portions 50-1, 50-2, 50-3.

FIG. 7d shows an enlarged view of the rectangle 710 in FIG. 7c, showing the deep trench portion 50-3 comprising a depth 27. The depth 27 may be in the range as described in the context of FIG. 2b. For example, the depth 27 may be around 13 µm.

FIG. 7e shows an enlarged view of the center rectangle 720 in FIG. 7c, showing the depth of bury 54 of the buried deep trench structure 50 below the main surface region 12' o. The depth of bury 54 may be in the range as described in the context of FIG. 2e. For example, the depth of bury 54 may be around 2 µm.

Figure 8:
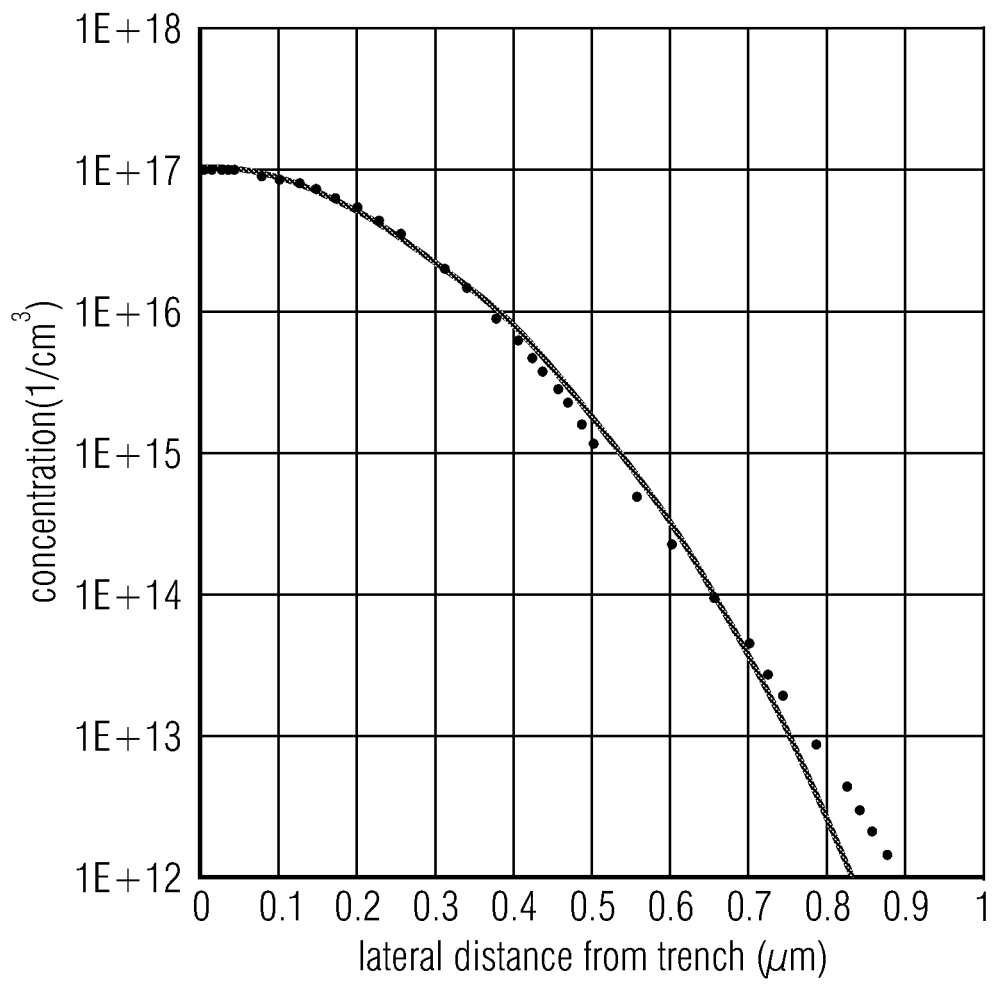
FIG. 8 shows a lateral distribution of dopants of a trench doping region of a sensor device according to an embodiment of the manufacturing method.

FIG. 8 shows an example of a lateral distribution of dopants in the trench doping region 60 of a sensor device manufactured according to an embodiment of the method 100. The plot shows a concentration of dopants along a lateral direction from a doped layer 32 into the thickened substrate 10'. Other distributions can however be obtained as desired.

Figure 9:
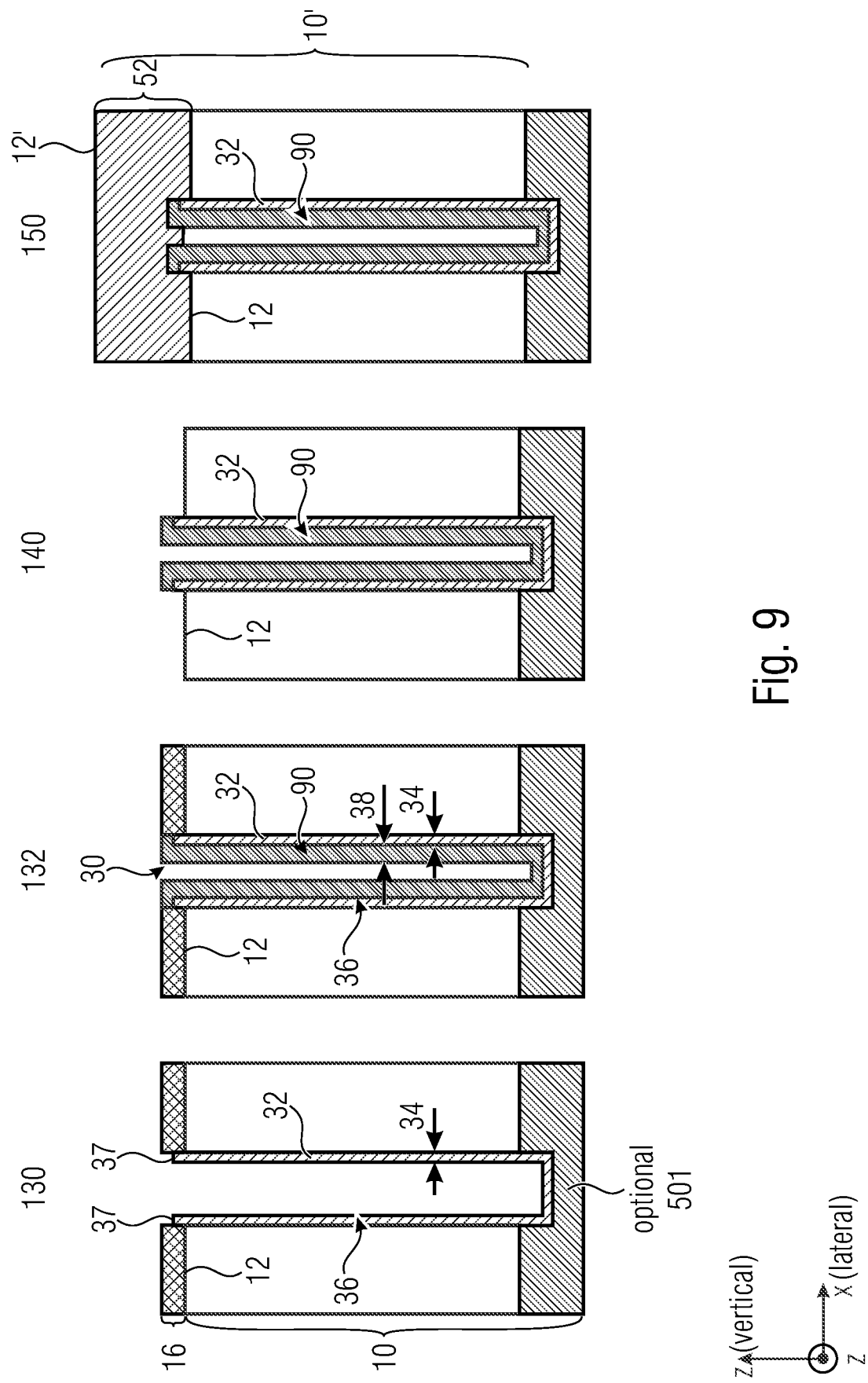
FIG. 9 shows schematic cross-sectional views (schematic snapshots) of a semiconductor substrate and elements of the sensor device at different stages of the manufacturing according to a further embodiment.

FIG. 9 shows schematic cross-sectional views (schematic snapshots) of a substrate and elements of the sensor device at different stages of the manufacturing according to a further embodiment, which comprises an additional step 132 of depositing 132 a trench coating layer 90 on a surface region 36 of the doped layer 32, wherein the selective depositing 130 of the doped layer 32 and the depositing 132 of the trench coating layer 90 together provide the coated deep trench structure 30.

FIG. 9 shows the stages of the manufacturing process after the steps 130, 132, 140 and 150. After step 130, the substrate 10, which may optionally comprise the buried doping region 501, still has the masking layer 16 and the deep trench structure is coated with the doped layer 32 having the thickness 34 and the surface region 36.

The additional depositing step 132 follows the step 130 of depositing the doped layer 32. The depositing 132 of the trench coating layer 90 may for example be an epitaxy process. For example, the depositing 132 may be a selective epitaxy process which is configured to deposit a semiconducting material primarily on the doped layer 32, such that the masking layer 16 may remain free of this material. The trench coating layer 90 may comprise a semiconductor material configured to reduce or block the out-diffusion of boron. The trench coating layer 90 may comprise an undoped semiconductor material, such as undoped silicon, but the trench coating layer 90 may also comprise a low-doped semiconductor material with a doping concentration less than the doping concentration of the doped layer 32. For example, the doping concentration of the trench coating layer 90 may be smaller than the doping concentration of the substrate 10. For example, the doping concentration of the trench coating layer 90 may be lower than $10^{15}$ cm$^{-3}$. The trench coating layer 90 may have a thickness 38, which may be lower than 1 μm. Alternatively, the trench coating layer 90 may comprise an insulating material, for example silicon nitride, for example in combination with the thickness 38 of the trench coating layer 90 being below 100 nm.

The trench coating layer 90 may cover the surface region 36 of the doped layer 32. At least, the trench coating layer 90 covers a top surface region 37 of the doped layer 32. For example, the top surface region 37 of the doped layer 32 may be a surface region of the doped layer 32 which extends vertically above the main surface region 12 of the substrate and which is adjacent to the masking layer 16.

The selective depositing 130 of the doped layer 32 and the depositing 132 of the trench coating layer 90 together provide the coated deep trench structure 30 which may comprise the dimensions and the functionality as described above. After the deposition 132 of the trench coating layer 90, the method 100 may be pursued with the removal 140 of the masking layer 16 and the deposition 150 of the semiconductor capping layer as described with respect to FIGS. 1-8.

By covering at least the top surface region 37 of the doped layer 32, the extent of the contact region between the doped layer 32 and the capping layer 52 may be reduced. In other words, the trench coating layer 90 is then configured to reduce the surface of the doped layer 32 which will be in contact with the capping layer 52 once it is formed. As a consequence, the amount of dopants that may diffuse from the doped layer 32 into the capping layer 52 during the depositing 150 of the capping layer 52 or during the subsequent step of out-diffusing 160 of dopants may be reduced. Reducing this diffusion may prevent the diffused dopants from interfering with elements in or on the capping layer 52, such as circuitry 70, during an operation of the sensor device.

Figure 10:
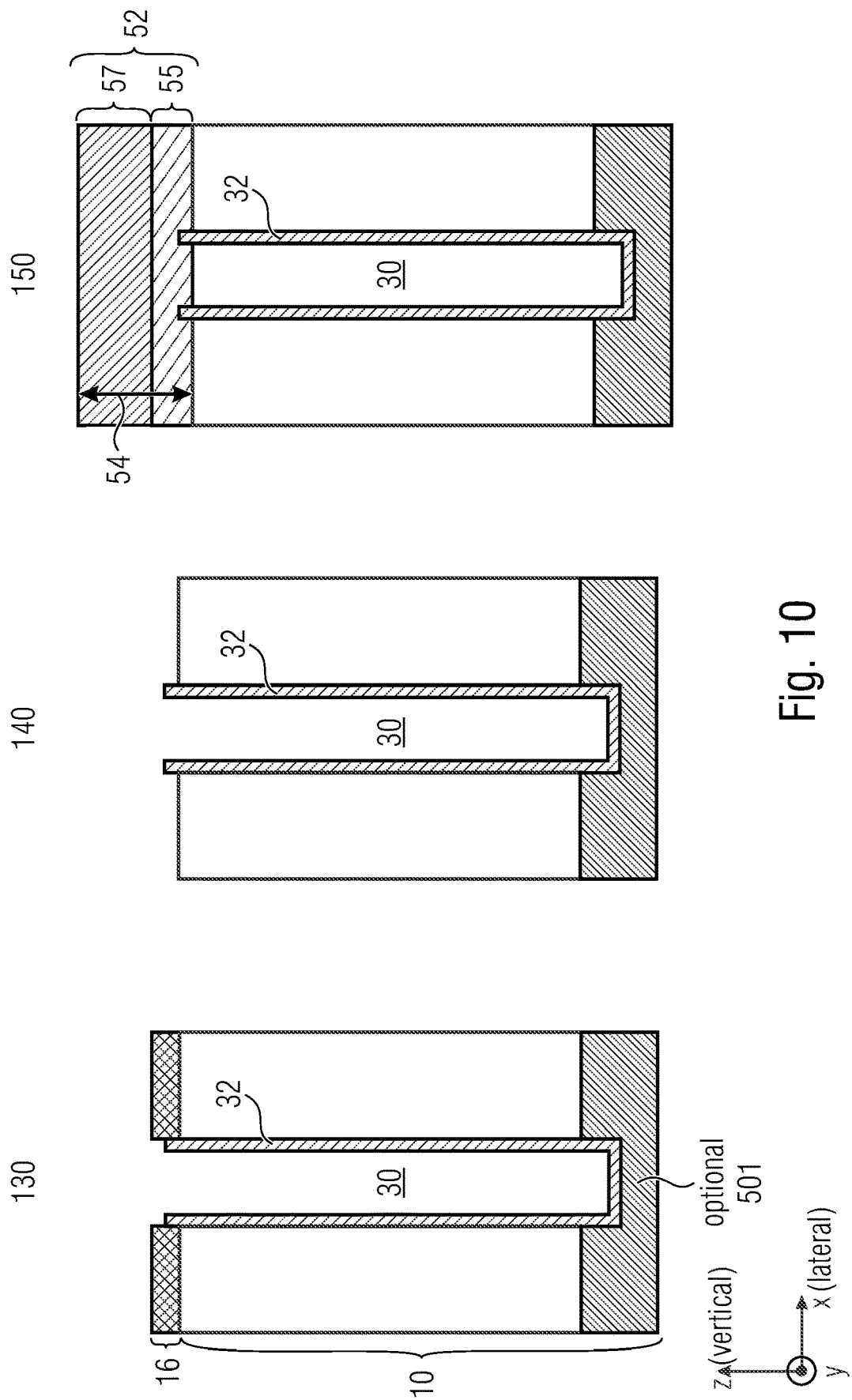
FIG. 10 shows schematic cross-sectional views (schematic snapshots) of a semiconductor substrate and elements of the sensor device at different stages of the manufacturing according to a further embodiment.

FIG. 10 shows schematic cross-sectional views (schematic snapshots) of the substrate 10 and elements of the sensor device after the steps 130, 140 and 150 of the manufacturing according to a further embodiment of the method 100. Steps 130 and 140 correspond to the steps 130 and 140 as described with respect to FIGS. 1-9. Optionally, the method may also comprise the deposition 132 as described above. According to the embodiment shown in FIG. 10, the step 150 of depositing the capping layer 52 comprises a step of depositing a first semiconductor capping layer 55 on the main surface region 12. Further, the depositing 150 comprises a step of depositing a second semiconductor capping layer 57 on the first semiconductor capping layer 55, the first semiconductor capping layer 55 and the second semiconductor capping layer 57 forming together the capping layer 52. During this step, the depositing 155 of the first semiconductor capping layer 55 is performed at a lower temperature than the depositing 157 of the second semiconductor capping layer 57.

The deposition of the first semiconductor capping layer 55 may be a deposition process like the deposition 150 of the capping layer 52 described with respect to FIGS. 1-9, but the deposition of the first semiconductor capping layer 55 may be performed at a lower temperature or process temperature as the deposition process described with respect to the deposition 150 in the description of the FIGS. 1-9. The deposition of the first semiconductor capping layer 55 closes the coated deep trench structure 30 as described with respect to the deposition 150 of the capping layer 52 in the description of the FIGS. 1-9.

The deposition of the second semiconductor capping layer 57 may for example be a growing of the second semiconductor capping layer 57 on top of the first semiconductor capping layer 55. The deposition of the second semiconductor capping layer 57 may be a deposition process like the deposition 150 described with respect to the FIGS. 1-9 and the deposition of the second semiconductor capping layer 57 may be performed at a temperature as described with respect to the deposition 150.

The temperature of the deposition of the first semiconductor capping layer 55 is for instance lower by more than 50° C. than the temperature of deposition of the deposition of the second semiconductor capping layer 57. For instance, the temperature difference may be more than 100° C., or more than 200° C.

Depositing the first semiconductor capping layer 55 at a lower temperature may help to reduce diffusion of dopants of the doped layer 32 into the capping layer 52.

Figure 11:
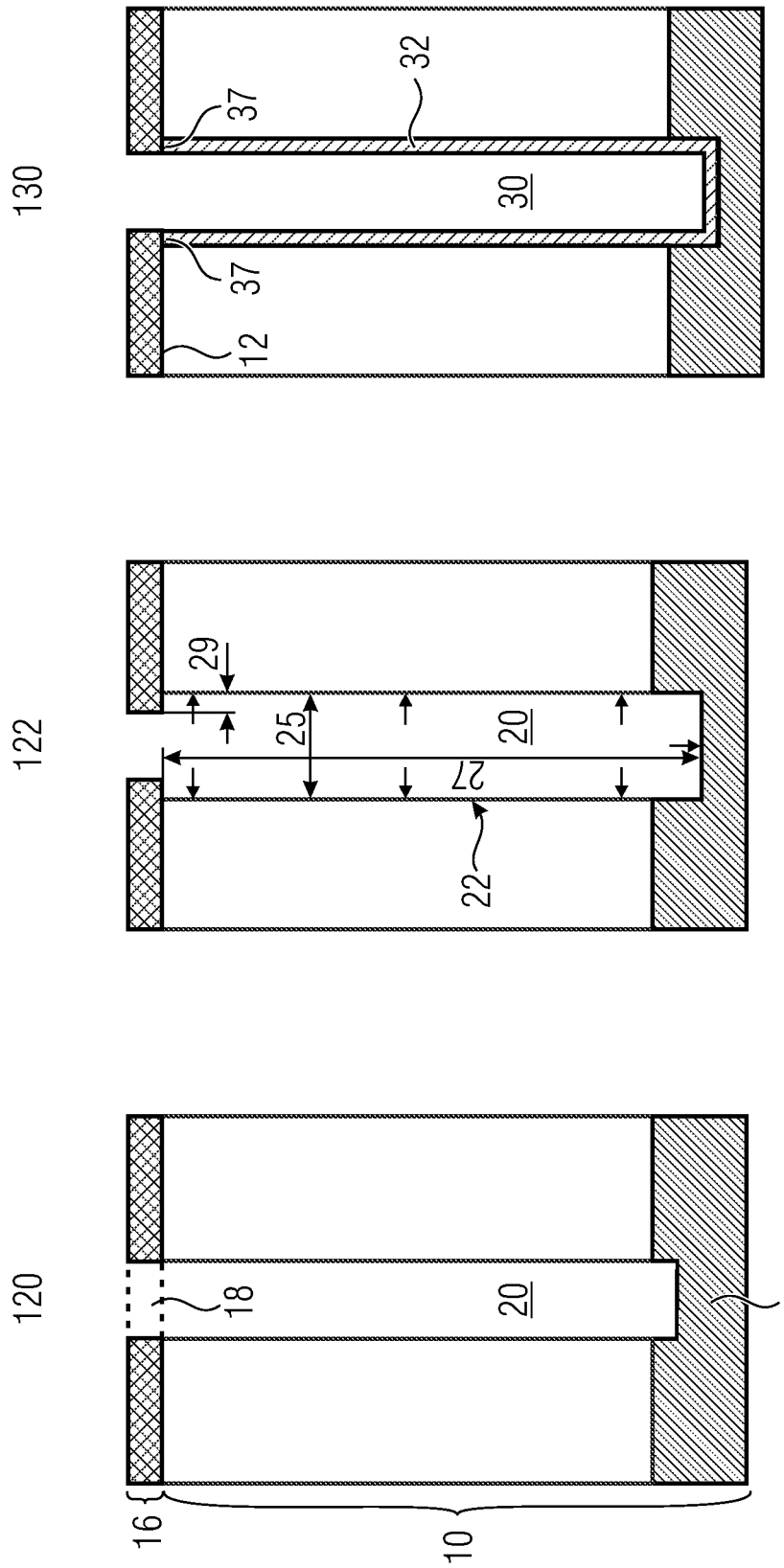
FIG. 11 shows schematic cross-sectional views (schematic snapshots) of a semiconductor substrate and elements of the sensor device at different stages of the manufacturing according to a further embodiment.

FIG. 11 shows schematic cross-sectional views (schematic snapshots) of a substrate and elements of the sensor device at different stages of the manufacturing process according to an embodiment. Between the steps 120 and 130, the embodiment comprises an additional step 122 of widening the deep trench structure 20, the steps of etching 120 and widening 122 together providing the deep trench structure 20.

The widening 122 of the deep trench structure 20 corresponds to a removal of matter of the substrate 10 from the surface 22 of the deep trench structure 20 over all or part of the height of the deep trench structure 20.

The widening 122 may be carried out using an isotropic etching process, for example a dry etch process. Alternatively, it may be carried out using an anisotropic etch process, such as a wet etch process.

The widening 122 may laterally remove material of the substrate 10 from a surface region of the deep trench structure 20 located adjacent or vertically below the masking layer 16 for providing an undercut 29 of the deep trench structure 20 with respect to the masking layer 16. In other words, in a region vertically below the masking layer 16, the deep trench structure 20 may have a larger lateral dimension than the revealed areas 18 (c.f. FIGS. 2a-b) of the masking layer 16, the excess of the lateral dimension of the deep trench structure regarding the revealed areas 18 of the masking layer 16 defining the undercut 29. The undercut 29 may also be regarded as an overhang of the masking layer 16 over the deep trench structure 20.

The dimension of the undercut 29 may be at least as large as the thickness 34 of the doped layer 32 which is deposited in the subsequent step 130. The undercut 29 of the deep trench structure 20 leads to a configuration in which the masking layer 16 caps the top surface region 37, as introduced with respect to FIG. 9, of the doped layer 32 after the doped layer 32 has been deposited in the subsequent step 130. However, in this embodiment, the top surface region 37 does not extend beyond the main surface region 12. In other words, the top surface region 37 of the doped layer 32 may be arranged vertically below the masking layer 16.

This configuration helps prevent lateral contacts between the doped layer 32 and the capping layer 52, reducing diffusion of dopants from the doped layer 32 into the capping layer 52, e.g. during the deposition 150 of the capping layer 52.

As indicated above, the steps of etching 120 and widening 122 together provide the deep trench structure 20. Following step 122, the subsequent process steps may be performed in accordance to the embodiments of FIGS. 1 to 9.

The embodiments of FIG. 9 to FIG. 11 may be combined, whether two of them according to all possible combinations, or all three of them.

Figure 12:
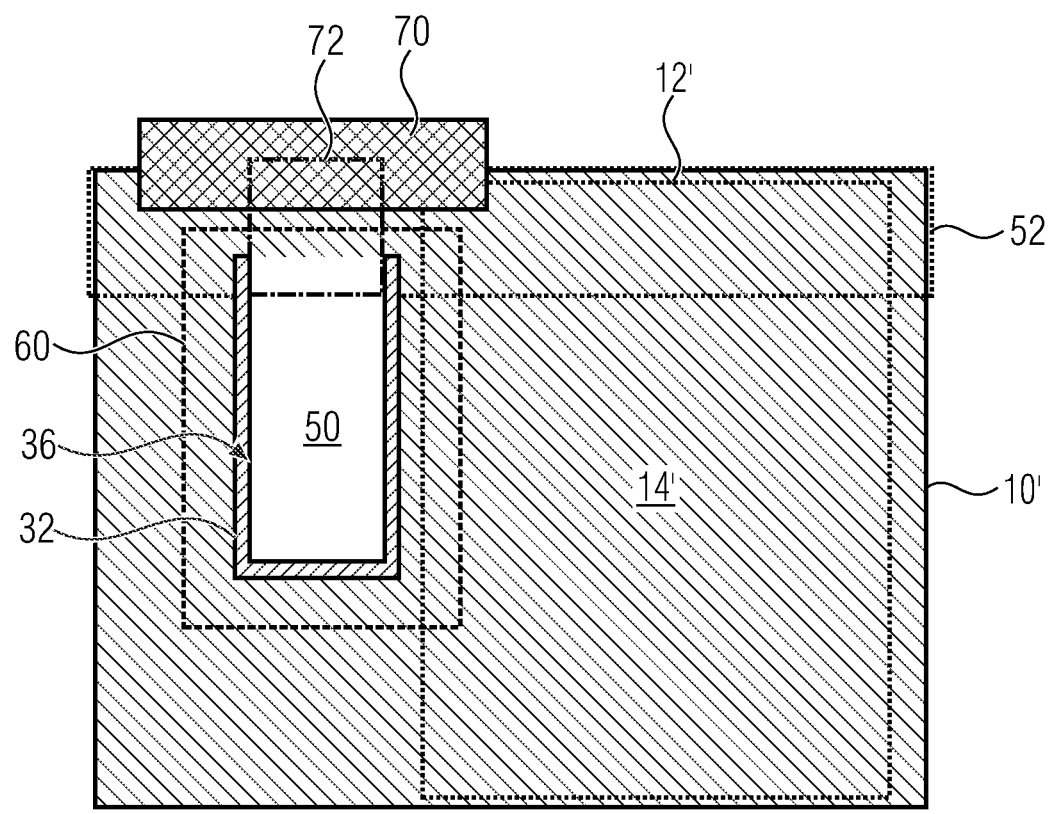
FIG. 12 shows a schematic cross-sectional view of a sensor device with a buried deep trench structure according to an embodiment.

FIG. 12 shows a schematic cross-sectional view of a sensor device with a buried deep trench structure according to an embodiment. The sensor device comprises the substrate 10' having the sensing region 14', the capping layer 52, the buried deep trench structure 50 comprising the doped layer 32, the trench doping region 60, and the electronic circuitry 70 for the sensing region 14' in the capping region 72 vertically above the buried deep trench structure 50.

The sensor device provides the functionalities and advantages as described with respect to the method 100 for manufacturing a sensor device.

In the foregoing Detailed Description, it can be seen that various features are grouped together in examples for the purpose of streamlining the disclosure. This method of disclosure is not to be interpreted as reflecting an intention that the claimed examples require more features than are expressly recited in each claim. Rather, as the following claims reflect, inventive subject matter may lie in less than all features of a single disclosed example. Thus, the following claims are hereby incorporated into the Detailed Description, where each claim may stand on its own as a separate example. While each claim may stand on its own as a separate example, it is to be noted that, although a dependent claim may refer in the claims to a specific combination with one or more other claims, other examples may also include a combination of the dependent claim with the subject matter of each other dependent claim or a combination of each feature with other dependent or independent claims. Such combinations are proposed herein unless it is stated that a specific combination is not intended. Furthermore, it is intended to include also features of a claim to any other independent claim even if this claim is not directly made dependent to the independent claim.

Although specific embodiments have been illustrated and described herein, it will be appreciated by those of ordinary skill in the art that a variety of alternate and/or equivalent implementations may be substituted for the specific embodiments shown and described without departing from the scope of the present embodiments. This application is intended to cover any adaptations or variations of the specific embodiments discussed herein. Therefore, it is intended that the embodiments be limited only by the claims and the equivalents thereof.

What is claimed is:

1. A method for manufacturing a sensor device with a buried deep trench structure, the method comprising:
providing a semiconductor substrate having a sensing region which extends vertically below a main surface region of the semiconductor substrate into the semiconductor substrate, wherein a masking layer is arranged on the main surface region of the semiconductor substrate;
etching a deep trench structure into the semiconductor substrate through revealed areas of the masking layer such that the deep trench structure is arranged laterally relative to the sensing region and vertically from the main surface region into the semiconductor substrate;
selectively depositing by epitaxy a doped semiconductor layer on a surface region of the deep trench structure to provide a coated deep trench structure;
at least partially removing the masking layer to reveal the main surface region of the semiconductor substrate;
depositing a semiconductor capping layer on the main surface region of the semiconductor substrate, wherein the semiconductor capping layer covers and closes the coated deep trench structure and forms together with the semiconductor substrate a thickened semiconductor substrate having the buried deep trench structure; and
out-diffusing dopants of the doped semiconductor layer into the thickened semiconductor substrate, wherein the out-diffused dopants provide a trench doping region that extends from the doped semiconductor layer into the thickened semiconductor substrate,
wherein depositing the semiconductor capping layer comprises:
depositing a first semiconductor capping layer on the main surface region of the semiconductor substrate; and
depositing a second semiconductor capping layer on the first semiconductor capping layer,
wherein the first semiconductor capping layer and the second semiconductor capping layer together form the semiconductor capping layer, and
wherein the depositing of the first semiconductor capping layer is performed at a lower temperature than the depositing of the second semiconductor capping layer.

2. The method of claim 1, wherein the doped semiconductor layer is deposited to have a doping concentration between $10^{16}$ and $10^{20}$ cm$^{-3}$ and a thickness in a range between 1 nm and 100 nm.

3. The method of claim 1, further comprising:
depositing a trench coating layer on a surface region of the doped semiconductor layer,
wherein the selective depositing of the doped semiconductor layer and the depositing of the trench coating layer together provide the coated deep trench structure.

4. The method of claim 1, further comprising:
widening the deep trench structure;
wherein the etching of the deep trench structure and the widening of the deep trench structure together provide the deep trench structure.

5. The method of claim 1, further comprising:
before the depositing of the semiconductor capping layer, filling the coated deep trench structure with a gas or with a dielectric material.

6. The method of claim 5, wherein the dielectric material filling the coated deep trench structure is optically opaque for an optical radiation to be detected in the sensing region.

7. The method of claim 1, wherein during the etching of the deep trench structure, a plurality of deep trench portions are etched into the semiconductor substrate to form the deep trench structure, and wherein the deep trench portions are formed to at least partially or completely laterally surround the sensing region in the semiconductor substrate.

8. The method of claim 1, wherein the deep trench structure has a depth in a range between 2 μm and 50 μm and has a width in a range between 50 nm and 2 μm.

9. The method of claim 1, wherein the semiconductor substrate comprises a buried doping region arranged vertically below the sensing region in the semiconductor substrate, wherein the sensing region and the buried doping region are arranged to have complimentary doping types, and wherein the deep trench structure extends vertically from the main surface region of the semiconductor substrate into the buried doping region.

10. The method of claim 1, further comprising
arranging an electronic circuitry for the sensing region in a capping region of the thickened semiconductor substrate vertically above the buried deep trench structure.

11. The method of claim 1, wherein the sensor device comprises optical operative sensing regions, and wherein the buried deep trench structure at least partially or completely laterally individually encloses separate ones of the optical operative sensing regions.

12. The method of claim 1, wherein the trench doping region is arranged to provide, in an operative condition of the sensor device, a defined electrical drift field distribution in sensing regions of the thickened semiconductor substrate.

13. The method of claim 1, wherein with the semiconductor capping layer in place, the coated deep trench structure is empty or filled with gas.

14. The method of claim 1, wherein with the semiconductor capping layer in place, the coated deep trench structure is filled with a dielectric material.

15. A method for manufacturing a sensor device with a buried deep trench structure, the method comprising:
providing a semiconductor substrate having a sensing region which extends vertically below a main surface region of the semiconductor substrate into the semiconductor substrate, wherein a masking layer is arranged on the main surface region of the semiconductor substrate;
etching a deep trench structure into the semiconductor substrate through revealed areas of the masking layer such that the deep trench structure is arranged laterally relative to the sensing region and vertically from the main surface region into the semiconductor substrate;
selectively depositing by epitaxy a doped semiconductor layer on a surface region of the deep trench structure to provide a coated deep trench structure;
at least partially removing the masking layer to reveal the main surface region of the semiconductor substrate;
depositing a semiconductor capping layer on the main surface region of the semiconductor substrate, wherein the semiconductor capping layer covers and closes the coated deep trench structure and forms together with the semiconductor substrate a thickened semiconductor substrate having the buried deep trench structure; and
out-diffusing dopants of the doped semiconductor layer into the thickened semiconductor substrate, wherein the out-diffused dopants provide a trench doping region that extends from the doped semiconductor layer into the thickened semiconductor substrate,
wherein with the semiconductor capping layer in place, the coated deep trench structure is empty or filled with gas.

16. A method for manufacturing a sensor device with a buried deep trench structure, the method comprising:
providing a semiconductor substrate having a sensing region which extends vertically below a main surface region of the semiconductor substrate into the semiconductor substrate, wherein a masking layer is arranged on the main surface region of the semiconductor substrate;
etching a deep trench structure into the semiconductor substrate through revealed areas of the masking layer such that the deep trench structure is arranged laterally relative to the sensing region and vertically from the main surface region into the semiconductor substrate;
selectively depositing by epitaxy a doped semiconductor layer on a surface region of the deep trench structure to provide a coated deep trench structure;
at least partially removing the masking layer to reveal the main surface region of the semiconductor substrate;
depositing a semiconductor capping layer on the main surface region of the semiconductor substrate, wherein the semiconductor capping layer covers and closes the coated deep trench structure and forms together with the semiconductor substrate a thickened semiconductor substrate having the buried deep trench structure; and
out-diffusing dopants of the doped semiconductor layer into the thickened semiconductor substrate, wherein the out-diffused dopants provide a trench doping region that extends from the doped semiconductor layer into the thickened semiconductor substrate,
wherein with the semiconductor capping layer in place, the coated deep trench structure is filled with only a dielectric material.

* * * * *